United States Patent
Takahashi et al.

(10) Patent No.: US 7,843,369 B2
(45) Date of Patent: Nov. 30, 2010

(54) ANALOG-TO-DIGITAL CONVERTER AND COMMUNICATION DEVICE AND WIRELESS TRANSMITTER AND RECEIVER USING THE SAME

(75) Inventors: Tomomi Takahashi, Musashino (JP); Takashi Oshima, Moriya (JP); Taizo Yamawaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 81 days.

(21) Appl. No.: 12/270,212

(22) Filed: Nov. 13, 2008

(65) Prior Publication Data

US 2009/0167578 A1 Jul. 2, 2009

(30) Foreign Application Priority Data

Dec. 27, 2007 (JP) ............................. 2007-336692

(51) Int. Cl.
H03M 1/10 (2006.01)
(52) U.S. Cl. .................. 341/120; 341/118; 341/119; 341/121; 341/151; 455/126; 455/127.2; 455/232.1; 455/246.1
(58) Field of Classification Search ......... 341/118–121, 341/142, 155; 455/127.2, 126, 232.1
See application file for complete search history.

(56) References Cited

U.S. PATENT DOCUMENTS

| | | | | |
|---|---|---|---|---|
| 5,701,600 | A * | 12/1997 | Wetters et al. | 455/208 |
| 6,819,910 | B2 * | 11/2004 | Shi et al. | 455/126 |
| 7,110,469 | B2 * | 9/2006 | Shi et al. | 375/295 |
| 7,203,466 | B2 * | 4/2007 | Muschallik et al. | 455/86 |
| 7,366,478 | B2 * | 4/2008 | Kerth et al. | 455/75 |
| 7,463,864 | B2 * | 12/2008 | Vassiliou et al. | 455/73 |
| 7,539,268 | B2 * | 5/2009 | Fechtel | 375/296 |
| 7,567,611 | B2 * | 7/2009 | Chien | 375/219 |
| 7,567,788 | B2 * | 7/2009 | Newton et al. | 455/237.1 |
| 7,672,645 | B2 * | 3/2010 | Kilpatrick et al. | 455/76 |
| 2007/0207760 | A1 * | 9/2007 | Kavadias et al. | 455/255 |

FOREIGN PATENT DOCUMENTS

JP 2004-242028 A 8/2004

OTHER PUBLICATIONS

Y. Chiu et al. "Least Mean Square Adaptive Digital Background Calibration of Pipelined Analog-to-Digital Converters", IEEE Transactions on Circuits and Systems I, vol. 51, pp. 38-46 (2004).

(Continued)

Primary Examiner—Linh V Nguyen
(74) Attorney, Agent, or Firm—Miles & Stockbridge P.C.

(57) ABSTRACT

In a wireless transmitter and receiver, a background calibration type analog-to-digital converter generally occupies a large area because of the phase compensating capacity of an op-amp included in a reference analog-to-digital conversion unit. Further, the calibration type analog-to-digital converter generally requires a sample and hold circuit to exclude influence of parasitic capacitance of wirings, thereby increasing power consumption. Digital calibration is performed by using, as a signal for calibration, an input signal of a digital-to-analog converter in a transmitter circuit of the wireless transmitter and receiver and inputting an output signal from the digital-to-analog converter to the analog-to-digital converter in the receiver circuit.

20 Claims, 11 Drawing Sheets

OTHER PUBLICATIONS

Takashi Oshima et al., "Fast Digital Background Calibration for Pipelined Type A/D Converters", The Institute of Electronics, Information and Communication Engineers, Technical Report of IEICE VLD 2006-138, ICD1006-229, pp. 115-120 (2007).

Andrew N. Karanicolas et al., "A 15-b 1-Msample/s Digitally Self-Calibrated Pipeline ADC", IEEE Journal of Solid-State Circuits, vol. 28, No. 12, pp. 1207-1215, Dec. 1993.

B. Hernes et al., "A 92.5mW 205MS/s 10b Pipeline IF ADC Implemented in 1.2V/3/3V 0.13μm CMOS", Nordic Semiconductor, Trondheim, Norway, 2007 IEEE International Solid-State Circuits Conference, Session 25.6, pp. 462-463 and 615, Feb. 2007.

C. Grace et al., "A 12b 80MS/s Pipelined ADC with Bootstrapped Digital Calibration", 2004 IEEE International Solid-State Circuits Conference, Session 25.5, Feb. 2004.

\* cited by examiner (a) OUTPUT FROM DAC CONVERTER (b) OUTPUT FROM AGC AND VARIABLE GAIN AMP

AGC

VARIABLE GAIN AMP

ANALOG-TO-DIGITAL CONVERTER AND COMMUNICATION DEVICE AND WIRELESS TRANSMITTER AND RECEIVER USING THE SAME

CLAIM OF PRIORITY

The present application claims priority from Japanese Patent Application JP 2007-336692 filed on Dec. 27, 2007, the content of which is hereby incorporated by reference into this application.

FIELD OF THE INVENTION

The present invention relates to an analog-to-digital converter and a communication device and a wireless transmitter and receiver using the same, and more particularly, to an analog-to-digital converter that has a function of using a digital signal to calibrate an output of the analog-to-digital converter and a wired and wireless communication device and a wireless transmitter and receiver using the same.

BACKGROUND OF THE INVENTION

A communication device, for example, an analog-to-digital converter, which is mounted on a radio device (wireless transmitter and receiver), has a calibration function to prevent its own characteristics from changing, even when there is a change in the environment, such as deviations in manufacturing processes, a fluctuation in temperature, a fluctuation in power supply voltage, or the like.

As one example of the analog-to-digital converter according to the related art, Yun Chiu (Y. Chiu et al., "Least mean square adaptive digital background calibration of pipelined analog-to-digital converters," IEEE Transactions on Circuits and Systems I Vol. 51, pp. 38-46 (2004) and Takashi Oshima, "Fast Digital Background Calibration for Pipelined Type ADC", The Institute of Electronics, Information and Communication, Technical Report of IEICE VLD 2006-138, 2007 disclose a background calibration type analog-to-digital converter that uses a reference analog-to-digital conversion unit.

A configuration example of the background calibration type analog-to-digital is shown in FIG. 18. A sample and hold circuit (S/H) 11 repeats the sampling and holding of an input analog signal in synchronization with a CLK signal. A reference analog-to-digital conversion unit 12 and a main analog-to-digital conversion unit 13 are connected to the sample and hold circuit 11 to convert the held voltage values into digital values, and output the converted digital values. An output of M bits of the main analog-to-digital conversion unit 13 is output as an output the calibration type analog-to-digital converter by means of a digital output generating section 14. The digital output generating section 14 performs, for example, an inner product operation of an output code of the main analog-to-digital conversion unit 13 and a weight vector $W_i$ output from a calibration section 15.

The calibration 15 uses the difference between the output of the digital output generating section 14 and the output of the analog-to-digital conversion unit 12 and forms a negative feedback loop that updates a present weight vector $W_i$ on the basis of the difference. As a result, the weight vector $W_i$ is automatically controlled until the output of the digital output generating section 14 is equal to the output of the reference analog-to-digital conversion unit 12, that is, a value where the input analog signal is accurately converted into the digital value. Further, the above-mentioned operation is described in detail in the Takashi Ohshima and therefore, the description thereof will not be repeated.

FIG. 19 shows an example where the background calibration type analog-to-digital converter is mounted on the wireless device. A transmission signal output from a baseband signal processing section 214 is converted into an analog signal by a digital-to-analog converter 215. Then, the interference wave components in the converted analog signal are removed in a filter 29. The output of the filter is multiplied, by a mixer 25, by a local oscillation signal that is generated from a voltage controlled oscillator 26, which is in turn frequency-converted into a transmission frequency. Thereafter, the frequency-converted signal is amplified by an amplifier 23, which is in turn transmitted from an antenna 21. On the other hand, the signal input from the antenna 21 is amplified in a low noise amplifier (LNA) 22, multiplied, by a mixer 24, by the local oscillation signal generated from the voltage controlled oscillator 26, and is frequency-converted into an intermediate frequency. The intermediate frequency is amplified in a variable gain amplifier 27. Then, the interference wave components in the amplified intermediate frequency are removed by a filter 28, which are in turn input to an analog-to-digital converter.

The analog-to-digital converter includes a main analog-to-digital conversion unit 212, a reference analog-to-digital conversion unit 211, a calibration section 213, a digital output generating section, and a sample and hold circuit 210. The operation of the calibration type analog-to-digital converter is the same as the foregoing contents. The output of the background calibration type analog-to-digital converter is input to the baseband signal processing section 214, and then subjected to a process of an upper layer.

On the other hand, the calibration is performed for every MDAC of each stage by setting outputs of a sub ADC within an MDAC for each stage, which configures a pipeline type analog-to-digital conversion section and detects the outputs. A foreground calibration (or self calibration) type analog-to-digital converter is already known in the related art.

Andrew N. Karanicolas, Member, IEEE, Hae-Seung Lee, Senior Member, IEEE, and Kantilal L. Bacrania, Member, IEEE, "A 15-*b* 1-Msample/s Digitally Self-Calibrated Pipeline ADC", IEEE JOURNAL OF SOLID-STATE CIRCUITS, VOL. 28, NO. 12, December 1993 discloses a foreground calibration type analog-to-digital converter that corrects a mismatch of a capacitor, an offset of a comparator, charge injection, a finite gain of an op-amp, and nonlinearity of a capacitor, or the like.

B. HERNES, J. Bjornsen, T. Andersen, A. Vinje, H. Korsvoll, F. Telsto, A. Briskemyr, C. Holdo, 0. Moldsvor, "A 92.5 mW 205 MS/s 10*b* Pipelined IF ADC Implemented in 1.2V/ 3.3V 0.13 µm CMOS", Nordic Semiconductor, Trondheim, Norway, 2007 IEEE INTERNATIONAL SOLID-STATE CIRCUITS CONFERENCE, Session 25.6, February 2007 and C. Grace, P, Hurst, S. Lewis, "A 12*b* 80 MS/s Pipelined ADC with Bootstrapped Digital Calibration," 2004 IEEE International Solid-State Circuits Conference, Session 25.5, February 2004 also disclose a foreground calibration type analog-to-digital converter having the same configuration.

Also, the C. Grace, P, Hurst, S. Lewis discloses a method that uses a dedicated digital-to-analog converter so as to generate a reference analog DC voltage.

Further, JP-A-2004-242028 discloses a method that corrects a relative error in gains between at least two analog-to-digital converters. In other words, in order to correct the relative error in the gains between the analog-to-digital converters, the JP-A-2004-242028 discloses a self regulation method of an AD converter that inputs an output of one digital-to-analog converter to at least two analog-to-digital converter and measures output levels from each analog-todigital converter so as to regulate the output levels according to the difference when there is the difference between the output levels.

SUMMARY OF THE INVENTION

Recently, a demand for a broadband radio device has rapidly increased including the data rate of a wireless LAN or a mobile phone. In particular, if the data rate exceeds about 100 Mbps, sample rate of several hundreds MS/s is needed. Also, in order to maintain interference wave resistance, high resolution of 10 bits or more is needed. A need exists for mounting on a radio device a calibration type analog-to-digital converter that can realize high-speed high-resolution analog-to-digital conversion while having low power consumption.

In order to realize the high sample rate and high-resolution conversion with low power consumption, the calibration type analog-to-digital converter is recently gained interest. In particular, the reason the calibration type analog-to-digital converter, which is concomitantly used with the reference analog digital conversion unit, has gained interest is because it has a short convergence time and can realize the digital calibration of a simple algorithm, as described in the Yun Chiu and the Takashi Ohshima.

The background calibration type analog-to-digital converter performs the calibration by using signals input from the antenna. In other words, the background calibration type analog-to-digital converter performs the calibration by using the signals received by the radio device without generating signals for self calibration. If the background type calibration method is used, there is an advantage that the calibration type analog-to-digital converter, which is necessary for the high-data rate radio device, can continuously performs bi-directional communication depending on a frequency division duplex (FDD) method that divides a channel according to a use frequency.

However, the background calibration type analog-to-digital converter generally occupies a large area because of the phase compensating capacity of the op-amp included in the reference analog-to-digital conversion unit. In addition, the calibration type analog-to-digital converter generally includes the sample and holds circuit to exclude the influence of parasitic capacitance of wirings, thereby increasing power consumption.

On the other hand, the foreground calibration type analog-to-digital converter disclosed in the above Andrew N. Karanicolas et al., the B.HERNES et al., and the C. Grace et al. individually performs the calibration for every MDAC of each stage, such that the algorithm for calibration becomes complicated and the convergence time becomes long. Further, the foreground calibration type analog-to-digital converter requires a circuit part that generates and outputs a signal for calibration in the MDAC of each stage and increases the number of parts and consequently, can not avoid an increase of a circuit area. In addition, the foreground calibration type analog-to-digital converter in the Andrew N. Karanicolas et al., the B.HERNES et al., and the C. Grace et al. disclosed that the reference signal to be used for calibration should be a DC voltage or a pseudorandom number signal, thus the transmission signal cannot be applied to the calibration.

Also, in the self regulation method of the AD converter described in JP-A-2004-242028, only the difference of the output levels between at least two analog-to-digital converters is regulated and the precision of relative gain between the plural analog-to-digital converters can be calibrated, but the precision of absolute gain or non-linearity of each analog-to-digital converter can not be calibrated.

The main problem to be solved by the present invention is to provide an analog-to-digital converter and a communication device and a wireless transmitter and receiver circuit using the same, which can perform high-speed and high precision digital calibration necessary for a high-data rate communication device without increasing a circuit area.

A representative example of the present invention is as follows. In other words, there is provided an analog-to-digital converter that is used for a receiver circuit of a communication device and performs calibration using a digital signal, the analog-to-digital converter comprising: an analog-to-digital conversion unit that converts an input analog signal into a digital signal; a calibration section that is connected to an output side of the analog-to-digital conversion unit; a digital output generating section that receives an output of the analog-to-digital conversion unit; and a transfer switch that is installed at an input side of the analog-to-digital conversion unit, wherein the transfer switch has a function that inputs any one of a received analog signal input to the receiver circuit and an analog signal for calibration, which is obtained by performing digital-to-analog conversion on a digital signal for calibration in a digital-to-analog converter in a transmitter circuit of the communication device, to the analog-to-digital conversion unit, wherein the calibration section is connected to an output of the digital output generating section, an output of the analog-to-digital conversion unit, and an input of the digital-to-analog converter, and wherein the calibration section has a function of acquiring a parameter that calibrates an output of the analog-to-digital conversion unit using a digital signal obtained by inputting the digital signal for calibration and the analog signal for calibration to the analog-to-digital conversion unit.

According to the present invention, the reference analog-to-digital conversion unit among the calibration type analog-to-digital converters, which is necessary for the high-data rate communication device, is substituted into the digital-to-analog converter for transmission, thereby decreasing the circuit area.

DETAILED DESCRIPTION OF THE PREFERRED EMBODIMENTS

With a representative embodiment of the present invention, a communication device includes: a receiver circuit that has an analog-to-digital converter; a baseband signal processing section that is connected to an output of the analog-to-digital converter; and a transmitter circuit that has a digital-to-analog converter connected to an output of the baseband signal processing section. An analog-to-digital converter includes: an analog-to-digital conversion unit that converts a received analog signal into a digital signal; a calibration section that is connected to an output side of the analog-to-digital conversion unit; a digital output generating section that receives an output of the analog-to-digital conversion unit; and a transfer switch that is installed at an input side of the analog-to-digital conversion unit.

The transfer switch has a function that inputs any one of the received analog signal and an analog signal for calibration to the analog-to-digital conversion unit. The analog signal for calibration is obtained by performing digital-to-analog conversion on a digital signal for calibration in a digital-to-analog converter in a transmitter. The calibration section is connected to an output of the digital output generating section, an output of the analog-to-digital conversion unit, and an input of the digital-to-analog converter, and the calibration section has a function that acquires a parameter which calibrates an output of the analog-to-digital conversion unit using a digital signal obtained by inputting the digital signal for calibration and the analog signal for calibration to the analog-to-digital conversion unit.

In particular, when the digital-to-analog converter is used for calibration, the digital-to-analog converter for transmission is used while its output is used as a signal for calibration, such that the reference analog-to-digital conversion unit becomes unnecessary, thereby reducing a mounting area. Further, since the output of the digital-to-analog converter for transmission is a peak hold waveform, a sample and hold circuit (S/H) becomes unnecessary and power consumption can be reduced.

In addition, the analog-to-digital converter of the present invention is suitable for foreground calibration. In other words, in a communication system adopting a time division duplex (TDD) method that performs bi-directional communication by time-dividing a channel having the same frequency, a transmitting and receiving timing is known, such that calibration can be performed instead by using a transmission section or a receive opening section.

Hereinafter, the exemplary embodiments of the present invention will be described with reference to the accompanying drawings.

First Embodiment

First, a basic configuration of a communication device including a foreground calibration type analog-to-digital converter according to a first embodiment of the present invention will be described with reference to FIG. 1 to FIG. 4.

Figure 1:
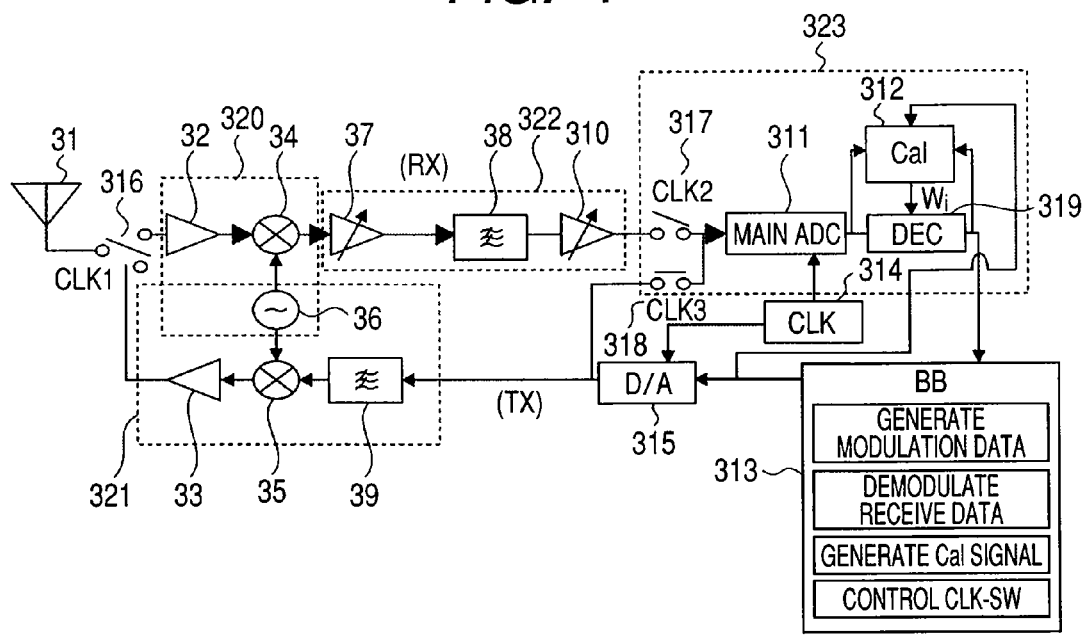
FIG. 1 is a view showing a basic configuration of a wireless transmitter and receiver circuit including an analog-to-digital converter according to a first embodiment of the present invention.

FIG. 1 is a view showing an entire circuit configuration of the present invention applied to a wireless transmitter and receiver. In FIG. 1, the wireless transmitter and receiver corresponds to a time division duplex (TDD) method and includes a first switch (CLK1) 316 that switches a transmitting and receiving system to an antenna 31. A receiver circuit RX includes: an RF section 320 for reception that is connected to the first switch, an intermediate frequency processing section 322 that is connected to an output of the RF section for reception; and a foreground calibration type analog-to-digital converter 323 that is connected to an output of the intermediate frequency signal processing section via a second switch (CLK2) 317. The output terminal of the analog-to-digital converter 323 is connected to the baseband signal processing section 313. On the other hand, a transmitter circuit (TX) includes: a digital-to-analog converter 315 that is connected to the output of the baseband signal processing section 313; and an RF section 321 for transmission that is connected to the output of the digital-to-analog converter. The RF section 321 for transmission is connected to the antenna 31 via the first switch 316.

Further, the RF section 320 for reception includes a low noise amplifier 32 and a mixer 34. Moreover, the RF section 321 for transmission includes a power amplifier 33, a mixer 35, and a filter 39. Reference number 36 denotes a voltage controlled oscillator that is commonly used for the mixers 34 and 35. The intermediate frequency signal processing section 322 includes a variable gain amplifier 37, a filter 38, and a variable gain amplifier 310. In addition, it may be permitted to make the number of filters or the number of variable gain amplifiers larger than the embodiment. Also, an arrangement position between the filter and the variable gain amplifier is not limited to the embodiment.

The analog-to-digital converter 323 includes: an analog-to-digital conversion unit (main ADC) 311; a digital output generating section (DEC) 319 that is connected to the output of the analog-to-digital conversion unit 311; and a foreground calibration section 312 that is connected to the output of the analog-to-digital conversion unit 311, the output of the digital output generating section 319, and the input of the digital-to-analog converter 315. The analog-to-digital conversion unit 311 corresponds to a high sample rate having low precision. An output of M bits of the analog-to-digital conversion unit 311 is output by the digital output generating section 319 as an output Dout from the calibration type analog-to-digital converter 311.

A CLK generating section 314 supplies clock signals, which are synchronized with each other, to the analog-to-digital conversion unit 311 and the digital-to-analog converter 315.

The output of the analog-to-digital converter 315 is connected to the input of the analog-digital conversion unit 311 in an analog-to-digital converter 323 via a third switch (CLK3) 318.

The baseband signal processing section 313 includes: a microprocessor that performs a control of a communication protocol upper layer, a digital signal processing processor (DSP) that performs a control of a physical layer, such as modulation, demodulation, or the like, or an oscillator direct digital synthesizer (DDS) that digitally generates a direct signal; and a memory device, or the like. Likewise a general transmitter and receiver, the baseband signal processing section 313 includes a modulation data generating function that generates a modulation data for modulating a transmission frequency and a receive data demodulating function that demodulates and encodes a receive data. These functions may be realized by performing each program, which is previously stored in the memory, by the microprocessor or the digital signal processing processor in the baseband signal processing section 313 that processes various data. On the other hand, these functions may be realized by a dedicated hardware including each function.

The baseband signal processing unit 313 also includes a function that generates the digital signal for calibration and generates a digital calibration signal d(cal) transmitted to the digital-to-analog converter 315 and the foreground calibration section 312 at a specific timing and a CLK switch controlling function that controls CLK switches (CLKs 1 to 3). A signal obtained by performing analog conversion on the digital calibration signal d(cal) may be a signal whose height of a horizontal portion is continuously changed in a step shape, for example, a signal in a step shape that approaches a triangle wave or a sine wave. Further, the signal is a periodically repeated signal ranging from a minimum value to a maximum value within a short section in every transmission signal section or in every receive signal section by the time division duplex (TDD) method and is generated by the DDS.

The CLK switch control function is synchronized with the timing of the transmission signal or the receive signal by the time division duplex (TDD) method to generate and output the switch control signal that controls an opening and closing of each CLK switch (CLKs 1 to 3). Also, the function that generates the digital calibration signal using the DDS or the CLK switch control function may be installed in other part dependently from the baseband signal processing section 313.

Herein, the function and operation of the analog-to-digital converter 323 will be described with reference to FIGS. 2A, 2B, and FIG. 2C and FIGS. 3A and 3B.

Figure 2A:
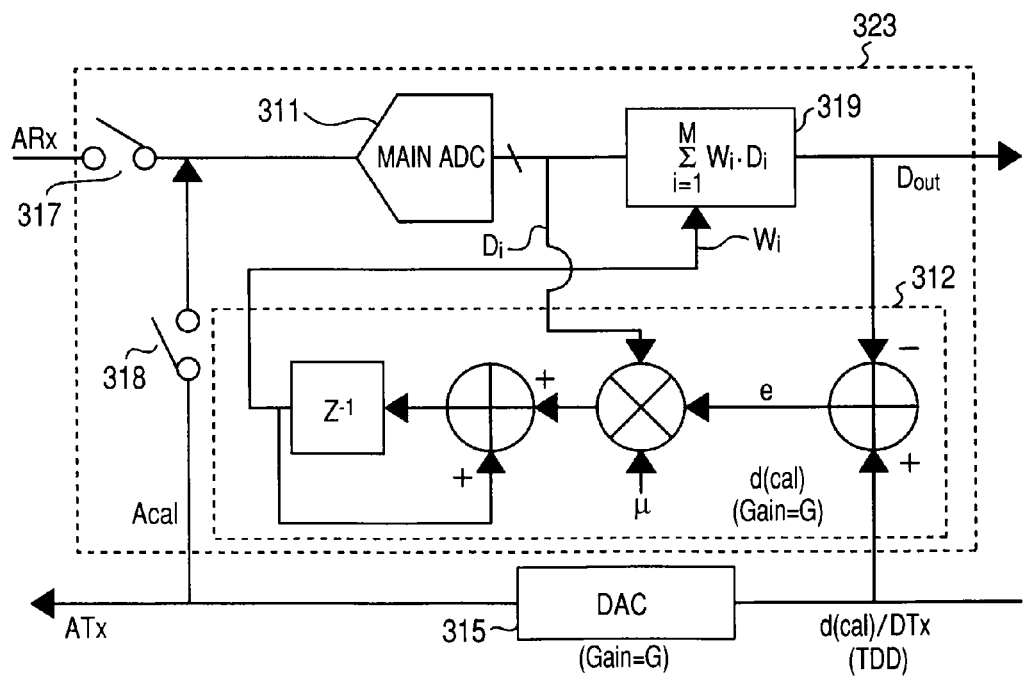
FIG. 2A is a block diagram showing one example of a function of the analog-to-digital converter according to the first embodiment.
Figure 3A:
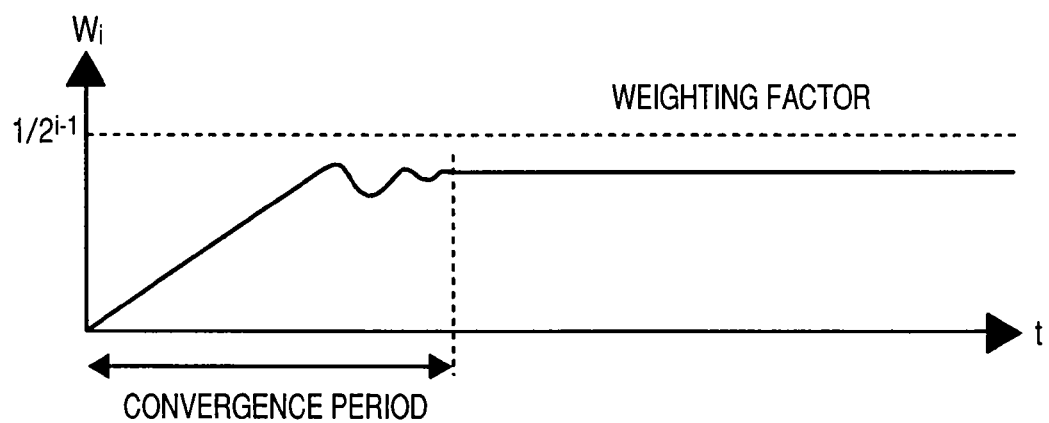
FIG. 3A is a view showing the passage of time of a parameter Wi at the time of calibration of the first embodiment.
Figure 3B:
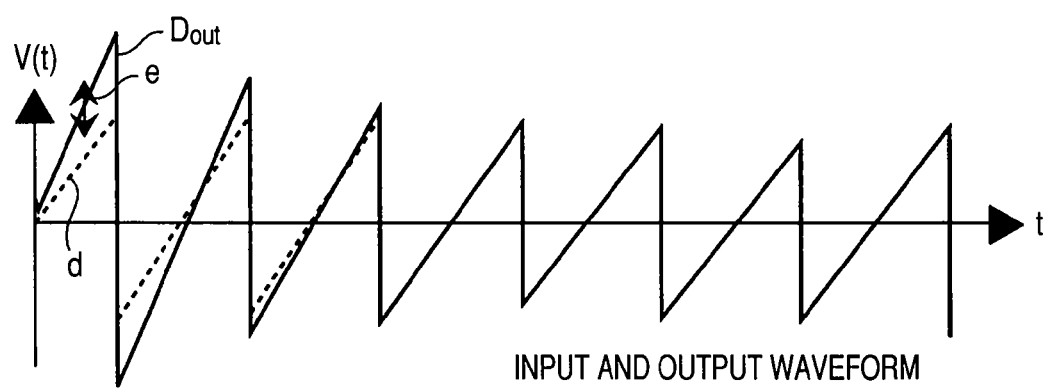
FIG. 3B is a view showing the passage of time of input and output waveforms d(cal) and Dout at the time of calibration of the first embodiment.

First, FIG. 2A is a block diagram showing one example of the function of the analog-to-digital converter 323. Further, FIG. 3A shows the passage of time of the parameter Wi when performing the calibration and FIG. 3B shows the passage of time of the input and output waveforms d(cal), Dout when performing the calibration. Moreover, as an example of a calibration dedicated signal, a triangle wave is used herein. Further, in the triangle wave, the height is microscopically changed in a step shape and regularly. In other words, the triangle wave is a signal that is continuously increased up to maximum amplitude. The calibration dedicated signal d(cal) generated in the baseband signal processing section 313 may be a signal, which is suitable for obtaining various parameters for calibrating the output of the analog-to-digital conversion unit in a short time. Also, when making a width of the output level of the analog-to-digital converter wide, that is, the input signal of the analog-to-digital converter having full amplitude, the convergence precision of the calibration becomes high and the convergence speed of the calibration becomes also fast.

The digital calibration signal d(cal) for calibration is digital-to-analog converted by the digital-to-analog converter 315, such that it becomes a analog signal Acal for calibration, then input to the analog-to-digital conversion unit 311 through the third switch 318. The input analog signal Acal is analog-to-digital converted in the analog-to-digital conversion unit 311, such that it becomes a digital signal Di. Further, a transmission signal DTX based on the modulation data generated in the baseband signal processing section 313 is digital-to-analog converted through the digital-to-analog converter 315, such that it becomes an analog signal ATX for transmission.

The digital calibration signal d(cal) (that is, the input of the digital-to-analog converter 315) and the output Di from the analog-to-digital conversion unit 311 (that is, the digital output is converted into Di through the analog-to-digital conversion unit 311 such that the digital calibration signal d(cal) is converted into the analog signal Acal through the digital-to-analog converter 315) are input to the calibration section 312. Further, when a gain of the digital-to-analog converter 315 is G, the digital calibration signal input to the calibration section 312 should have a relationship of d(cal)×G. In the first embodiment, gain G=1 for convenience of explanation.

Further, the output Dout of the digital output generating section 319 is input to the calibration section 312. The parameter Wi for calibrating the output of the analog-to-digital conversion unit 311 is obtained as the output of the calibration section 312 on the basis of the inputted information. The parameter Wi and the output Di of the analog-to-digital conversion unit 311 are input to the digital output generating unit 319. The output Dout of the digital output generating unit 319 becomes the output of the analog-to-digital converter.

In the calibration section 312, an error e between the output Dout of the digital output generating section 319 and the input d(Cal) of the digital-to-analog converter 315 is calculated.

The parameter Wi is updated according to an LMS algorithm for the negative feedback loop from the calculated results (the detailed description of the LMS algorithm can be found in the Takashi Ohshima).

The detailed configuration example of the analog-to-digital conversion unit 311 will be described herein with reference to FIG. 2C. The analog-to-digital conversion unit 311 is realized, for example, the pipeline type analog-to-digital converter section. The pipeline type analog-to-digital converter section has a configuration where basic blocks called the multiplying DAC (MDAC) are serially connected by the required number of stages according to the required resolution. Further, MDAC is configured of a switch capacitor based on the op-amp. The input sides of MDACs in each stage are provided with sampling switches.

MDAC 311-1 in an initial stage of the analog-to-digital conversion unit 311 that coarsely quantizes analog signal voltage, which is input to the analog-to-digital converter, with n1 bit and transfers the quantized results to the digital output generating section 319 and the digital calibration section 312 and at the same time, amplifies quantization error voltage Res generated at this time and transfers and commits the amplified quantization error voltage Res to MDAC 311-2 in a subsequent stage and commits the process on the amplified quantization error voltage Res to MDAC 311-2. MDAC 311-2 that is committed the process coarsely quantizes the error voltage Res output from MDAC 311-1 in the previous stage with n2 bit and transfers the quantized results to the digital output generating section 319 and the digital calibration section 312 and at the same time, amplifies quantization error voltage Res generated and transfers and commits the amplified quantization error voltage Res generated at this time to MDAC 311-2 in a subsequent stage and commits the process on the amplified quantization error voltage Res to MDAC 311-3 in a third stage. The process of the following stage is the same as the above-mentioned description.

The last stage ($L^{th}$ stage) is simply configured of a coarse quantizer SADC 311-L to coarsely quantize the quantization error voltage output from MDAC 713 in an $L-1^{th}$ stage of the previous stage with nL bit and transfers the quantized results with the digital output generating section 319 and the digital calibration section 312.

The digital output generating section 319 performs an inner product of the values transferred from each MDAC and a suitable weight row obtained by the digital calibration, thereby determining the final digital output value Dout.

The digital calibration signal d(cal) gives the so-called correct conversion results to the digital calibration section 312. For this reason, the digital calibration par 312 reaches the correct weight row using this correct conversion results.

The second switch (CLK2) and the third switch (CLK3) 318 may be permitted to use the sampling switch of MDAC 311-1 in the initial stage of the analog-to-digital conversion unit.

In the embodiment of the present invention, the digital calibration signal d(cal) for calibration is digital-to-analog converted by the digital-to-analog converter 315, such that it becomes the analog-to-digital signal Acal for calibration, then input to the MDAC 311-1 during the initial stage of the analog-to-digital conversion unit through the sampling switch.

In the present invention, an input path of the digital calibration signal d(cal) for the analog-to-digital conversion unit 311 is a single. Therefore, the algorithm for calibration may also be simple. Further, in order to simultaneously progress the calibration of all the MDACs, the convergence time of calibration becomes short. In this regard, the digital calibration signal is input to each of MDACs in plural stages configured by the analog-to-digital conversion unit, such that the analog-to-digital converter of the present invention is different from the foreground calibration type analog-to-digital converter, which are disclosed in the Andrew N. Karanicolas et al., the B.HERNES et al., and the C. Grace et al. that individually calibrate each MDAC, in terms of the configuration, action, and effect.

In addition, since the sampling of the digital-to-analog converter 315 is generally faster than that of the reference analog-to-digital conversion unit, it can shorten the convergence time of calibration as compared to the case of using the receiving signal as the signal for calibration. Further, the height of the horizontal portion, which is suitable for acquiring the parameter for calibrating the output of the analog-to-digital conversion unit in a short time, is continuously changed in a step shape, making it possible to generate the calibration dedicated signal in the baseband signal processing section 313. For this reason, it is automatically converged with the parameter value Wi in a short time as compared to the case of using the receiving signal. In other words, high-speed and high-precision calibration can be achieved.

In FIG. 2A, when not performing the digital calibration, a receive signal ARX is input the analog-to-digital converter 323 through the second switch 317.

Needles to say, the function of the analog-to-digital converter 323 of the present invention is not limited the example of the block diagram of FIG. 2A.

Figure 2B:
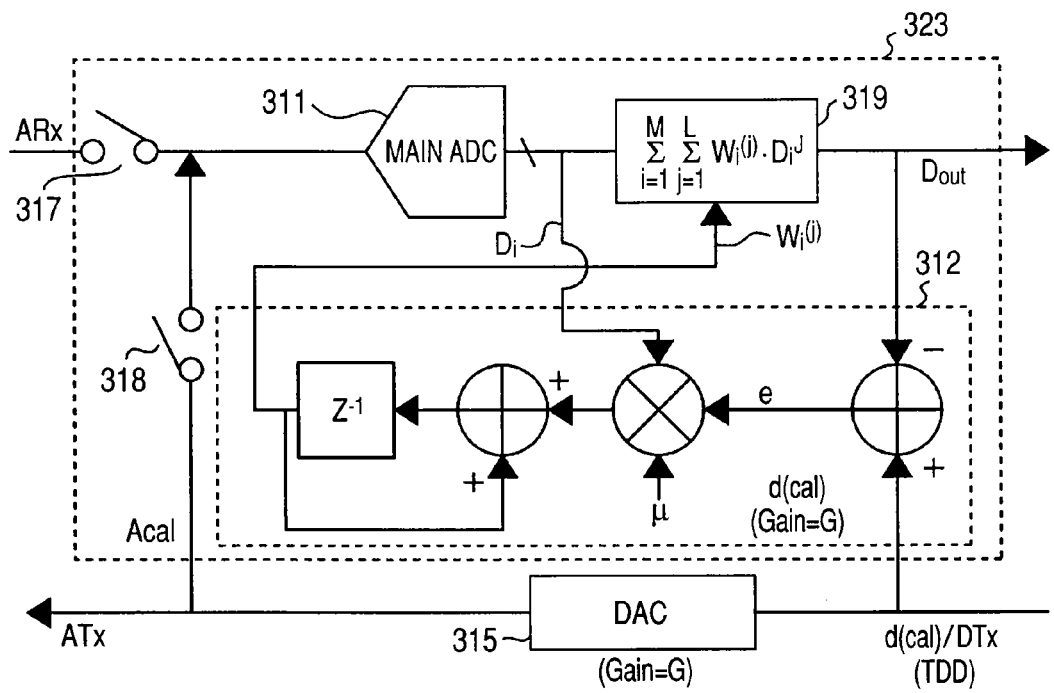
FIG. 2B is a block diagram showing another example of a function of the analog-to-digital converter according to the first embodiment.
Figure 2C:
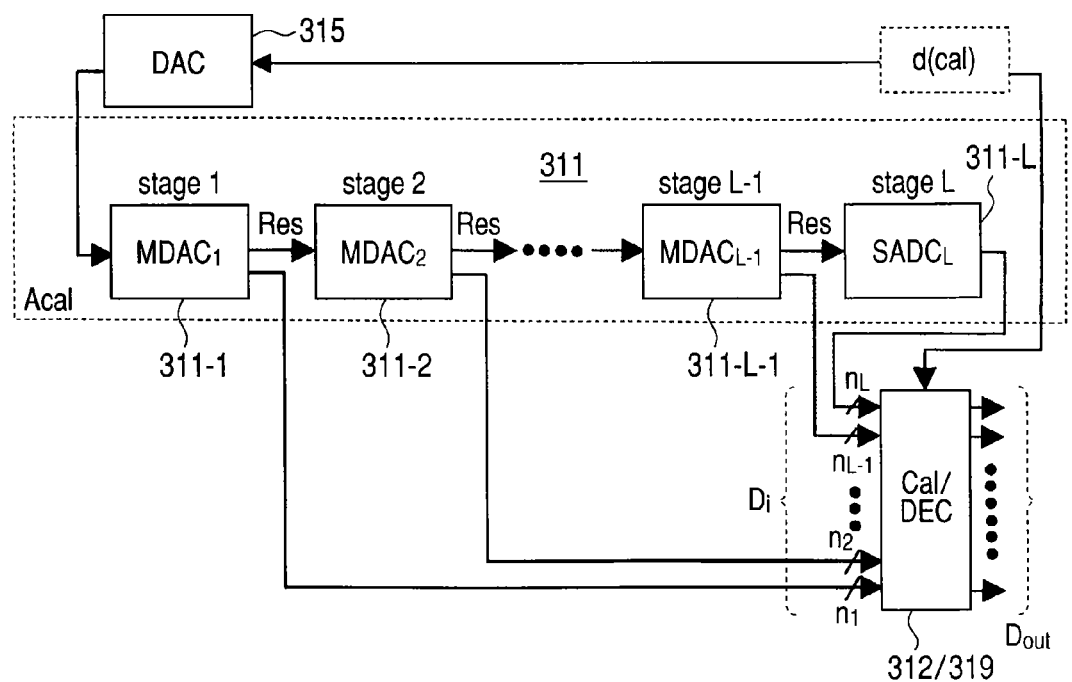
FIG. 2C is a view showing a concrete configuration example of the analog-to-digital conversion unit according to a first embodiment.

For example, the analog-to-digital converter of the present invention may be configured like the example of the block diagram of FIG. 2B. In this example, the parameter value, which is input from the digital calibration section 312 to the digital output generating section 319, becomes $Wi^{(j)}$ and the digital output generating section 319 performs an operation process as the following equation 1.

$$\sum_{i=1}^{M} \sum_{j=1}^{L} W i^{(j)} \cdot D_i^j \qquad \text{[Equation 1]}$$

When adopting the method of FIG. 2B, the non-linearity of the op-amp within MDAC can effectively be calibrated.

Next, the operation of the wireless transmitter and receiver corresponding to the time division multiplexing (TDD) method according to the present invention will be described with reference to FIGS. 1 and 4.

Figure 4:
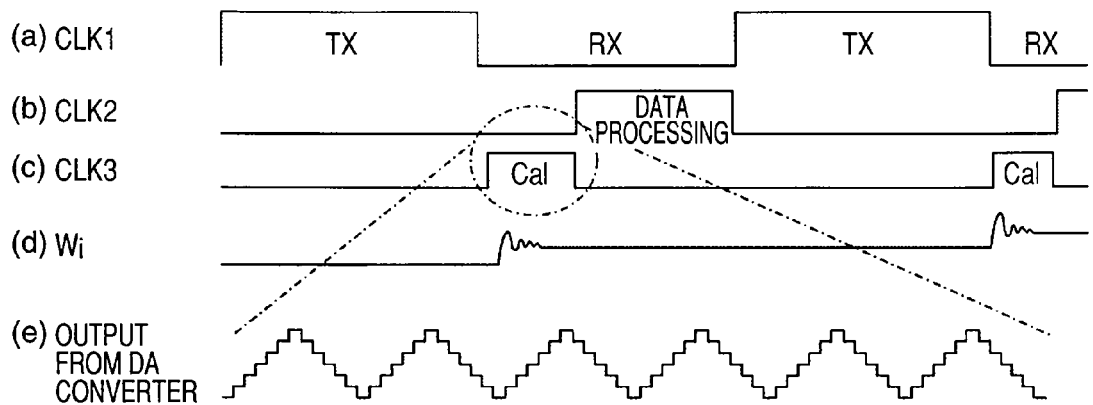
FIG. 4 is a time chart showing an operation of a first embodiment of the present invention.

When the wireless transmitter and receiver performs transmission (section TX), the switch control signal CLK1 becomes high and the switch control signals CLK2 and CLK 3 become low, as shown in FIG. 4,(a)-(c). As a result, the first switch (CLK1) 316 is connected to the RF section 321 for transmission, the second switch (CLK2) 317 is opened, and the third switch (CLK3) 318 is opened. Also, the output DTX of the baseband signal processing section 313 is input to the digital-to-analog converter 315. Further, the output ATX of the digital-to-analog converter 315 is in a waveform shape in the filter 39 and then multiplied by the local oscillation signal generated from the voltage controlled oscillator 36 by the mixer 35 and amplified by the power amplifier 33, which is in turn transmitted from the antenna 31.

After transmission, the wireless transmitter and receiver are in the receive period (section RX). The switch control signal CLK1 and the switch control signal CLK2 become low in a first predetermined Cal section of the receive period and the switch control signal CLK3 becomes high, as shown in FIG. 4,(a)-(c). As a result, the first switch 316 is connected to the RF section 320 for reception and the third switch 318 is closed while the second switch 317 is opened. In this state, the baseband signal processing section 313 outputs the dedicated signal d(cal) for calibrating the analog-to-digital converter 323, which are enlarged in FIG. 4(e). The same signal is input to the calibration section 312 and is converted into the analog signal Acal in the digital-to-analog converter 315, which is in turn input to the analog-to-digital conversion unit 311. Also, in order to perform the calibration according to the change in the environment, such as power supply voltage, temperature, deviation of the manufacturing process of the wireless transmitter and receiver, etc., the parameter (weight coefficient Wi) for calibrating the output of the analog-to-digital conversion unit 311 as shown in FIG. 4(d) as the output of the calibration section 312 is obtained. The parameter and the output Di of the analog-to-digital conversion unit 311 are input to the digital output generating section 319, such that the output Dout of the digital output generating section 319 can be obtained as the output of the analog-to-digital converter 323.

The output Dout of the digital output generating section 319, the output Di of the analog-to-digital conversion unit 311, and the input d(cal) of the digital-to-analog conversion 315 are input to the calibration section 312. The input d(cal) of the digital-to-analog conversion 315 is used as the reference signal in the calibration section 312. Also, the CLK generating section 314 supplies the clock signals, which are synchronized with each other, to the analog-to-digital conversion unit 311 and the digital-to-analog converter 315.

Further, the calibration of the analog-to-digital converter 323 as described above is performed in an extremely small portion of the initial receive period as shown in FIG. 4(c), such that the reception of data is not disturbed. Moreover, as shown in FIG. 4(c), the parameter (weight coefficient Wi) for performing the calibration is maintained up to the subsequent Cal period.

Next, when receiving the receive data (data processing section within RX), the switch control signal CLK2 becomes high and the switch control signals CLK1 and CLK3 become low, as shown in FIG. 4,(a)-(e). As a result, the first switch 316 is connected to the RF section 320 for reception. Further, the second switch 317 is closed to connect the output of the intermediate frequency signal processing section 322 to the input of the analog-to-digital converter 323. The signal received in the antenna 31 is amplified in the low noise amplifier 32 and multiplied by the local oscillation signal generated from the voltage controlled oscillator 36 by the mixer 34, and then frequency-converted into the intermediate frequency signal ARX. After the intermediate frequency signal is amplified in the variable gain amplifier 37, the interference wave components are removed in the filter 38, which is in turn amplified in the variable gain amplifier 310 and is input (input analog signal) to the analog-to-digital converter 323. The digitized signal by the analog-to-digital converter 323 is subjected to the demodulation of data, the process of the upper layer, or the like by the baseband signal processing section 313.

As described above, the calibration dedicated signal is generated in the baseband signal processing section 313 and the digital-to-analog converter 315 and transfers the generated calibration dedicated signal as the reference signal to the calibration section 312, such that the reference analog-to-digital conversion unit is unnecessary. Thereby, the circuit area can be drastically reduced.

Further, since the output of the digital-to-analog converter 315 is generally a peak hold waveform, clock skew is also drastically reduced, such that the sample and hold circuit is unnecessary. As a result, power consumption can be drastically reduced. Also, since the sample rate of the digital-to-analog converter 315 is generally faster than the reference analog-to-digital converter unit, the convergence time of calibration can be shortened. Moreover, since the calibration dedicated signal can be generated in the baseband signal processing section 313, the calibration can be performed by inputting the signal having the desired amplitude level and the optimal waveform to the analog-to-digital converter 323, such that the high-speed and high-precision calibration can be achieved.

As described above, according to the first embodiment, the circuit area can be drastically reduced. Further, because the sample and hold circuit is unnecessary, current consumption is reduced. Moreover, since the calibration dedicated signal is generated in the baseband signal processing section, the convergence precision is improved by inputting the signal having full amplitude and the optimal waveform to the analog-to-digital conversion unit. Also, since the sampling of the digital-to-analog converter is faster than the reference analog-to-digital conversion unit, the high-speed calibration can be achieved.

Second Embodiment

Figure 5:
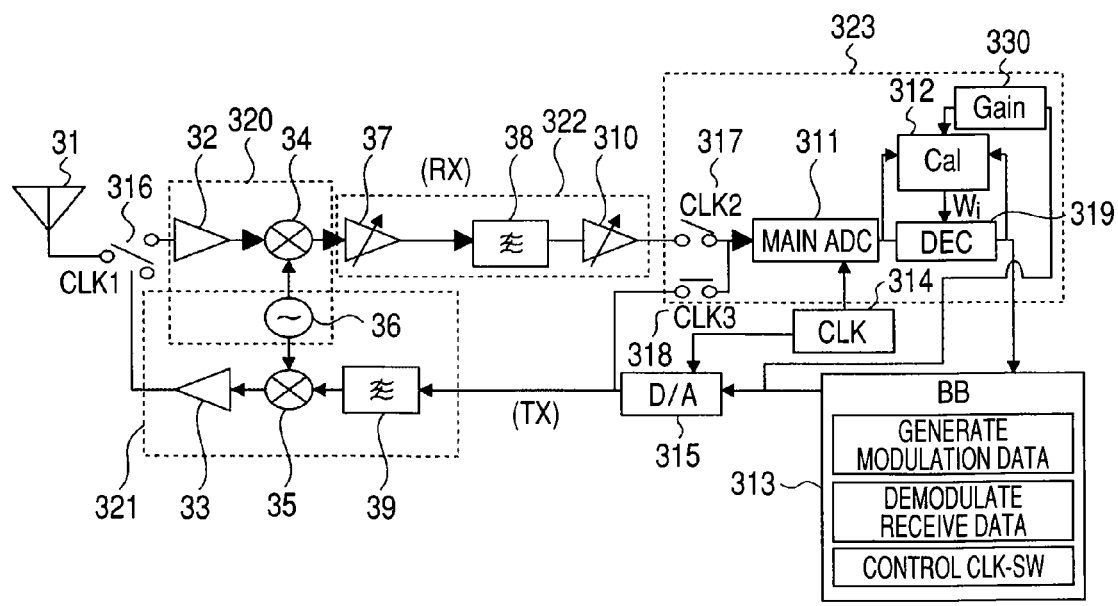
FIG. 5 is a view showing a basic configuration of a wireless transmitter and receiver circuit including an analog-to-digital converter according to a second embodiment of the present invention.
Figure 6:
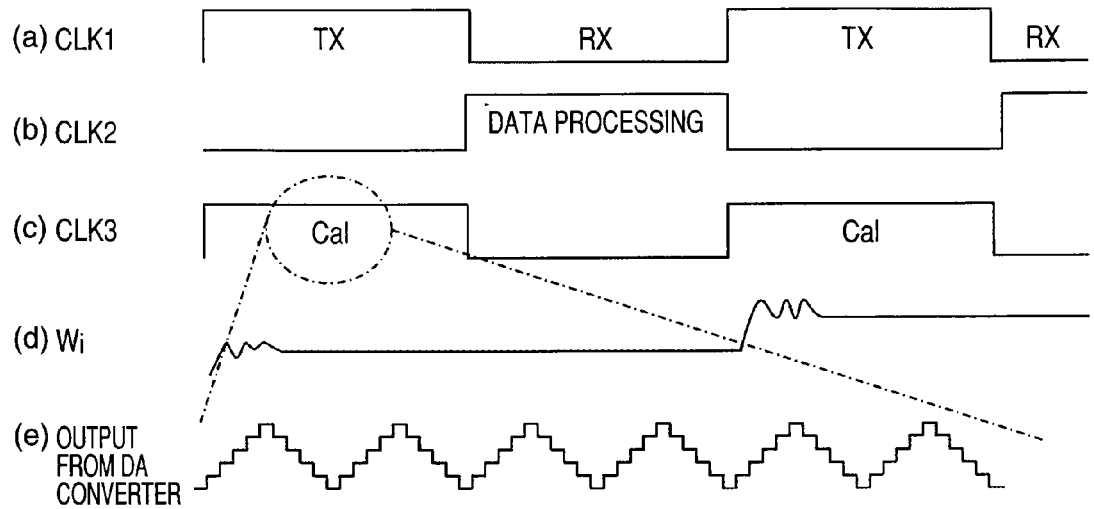
FIG. 6 is a time chart showing an operation of the second embodiment of the present invention.

Next, a basic configuration of a communication device including a foreground calibration type analog-to-digital converter according to a second embodiment of the present invention will be described with reference to FIGS. 5 and 6. FIG. 5 shows the entire circuit configuration of the wireless transmitter and receiver to which the present invention is applied. FIG. 6 is a time chart showing the operation of the calibration type analog-to-digital converter 323.

The baseband signal processing section 313 includes a modulation data generating function that generates a modulation data for modulating the transmission frequency, a receiving data demodulation function that demodulates and codes the receiving data, and a CLK switch control function that controls CLK switches (CLK 1 to 3). In the second embodiment, the transmission received is also used in the digital calibration signal d(cal). For this reason, the baseband signal processing section 313 does not have the function that independently generates the digital calibration signal.

However, according to the use, there may be a case where the waveform of the transmission signal used for communication, or the like, may not necessarily be optimal for high-precision and high-speed calibration. As a variation example, the baseband signal processing section 313 also has a function that independently generates the calibration dedicated signal meeting high precision and high speed requirements, which is suitable for calibration and can be permitted so as to use the transmission signal and the calibration dedicated signal as the calibration signal according to the use.

As shown in an enlarged view of FIG. 6(e), the digital calibration signal is a waveform that approaches the transmission waveform where the modulation digital signal is converted into the analog signal, for example, the continuously changing sine wave in a step shape.

A gain adjuster 330 adjusts digital calibration signal input to the calibration section 312 so that the digital calibration signal has the relationship of d(cal)×G, when the gain of the digital-to-analog converter 315 is G.

When the wireless transmitter and receiver performs transmission, as shown in FIG. 6,(a)-(c), the switch control signals CLK1 and CLK3 become high and the switch control signal CLK2 becomes low. As a result, the first switch 316 is connected to the RF section 320 for transmission, the second switch 317 is opened, and the third switch (CLK3) 318 is closed. Thereby, the output of the digital-to-analog converter 315 and the input of the analog-to-digital converter 323 are connected. In this state, the transmission signal DTX output by the baseband signal processing section 313 is input to the digital-to-analog converter 315. The output RTX of the digital-to-analog converter 315 is in a waveform-shape in the filter 319 and then multiplied by the local oscillation signal generated from the voltage controlled oscillator 36 by the mixer 35, which is in turn transmitted from the antenna 31.

Simultaneously with the above-mentioned transmission process, the transmission signal RTX converted into the analog signal in the digital-to-analog converter 315 is also input to the analog-to-digital conversion unit 311 of the analog-to-digital converter 323 through the third switch 318. The output Di is obtained through the analog-to-digital conversion unit 311 and the output Dout is also obtained through the digital output generating section 319. On the other hand, the transmission signal DTX is adjusted to have the same gain G as the gain G of the digital-to-analog converter 315 in the gain adjuster 330, such that it is DTX', which is input to the calibration section 312. Hereinafter, the calibration of the analog-to-digital converter 323 is performed on the basis of these information pieces Di, Dout, and DTX as in the first embodiment.

Next, in the receive period, as shown in FIG. 6,(a)-(c), the switch control signals CLK1 and CLK3 become low and the switch control signal CLK2 become high. As a result, the first switch 316 is connected to the RF section 320 for reception, the second switch 317 is closed to connect the output of the intermediate frequency signal processing section 322 to the input of the analog-to-digital converter 323. Further, in the second embodiment, since the calibration of the analog-to-digital converter 323 is not performed during the receive period, the third switch 318 is closed and the output of the digital analog converter 315 and the input of the analog-to-digital converter 323 are separated. In this state, as described in the first embodiment, the general receive process is performed.

As described above, since the second embodiment does not use the dedicated signal for performing the calibration of the analog-to-digital converter 323 as in the first embodiment but uses the transmission signal itself for performing the calibration, it can perform the calibration during the transmission period. For this reason, the entire receiving period is used for the receiving process.

In the present invention, as the signal used for the calibration, a waveform other than the waveform shown in the first and second embodiments may be permitted. Even in some cases, it is preferable that a peak value of the high frequency is increased or decreased regularly or in a step shape. Thereby, the time up to the convergence of calibration can be shortened and the convergence precision can be improved.

Third Embodiment

Figure 7:
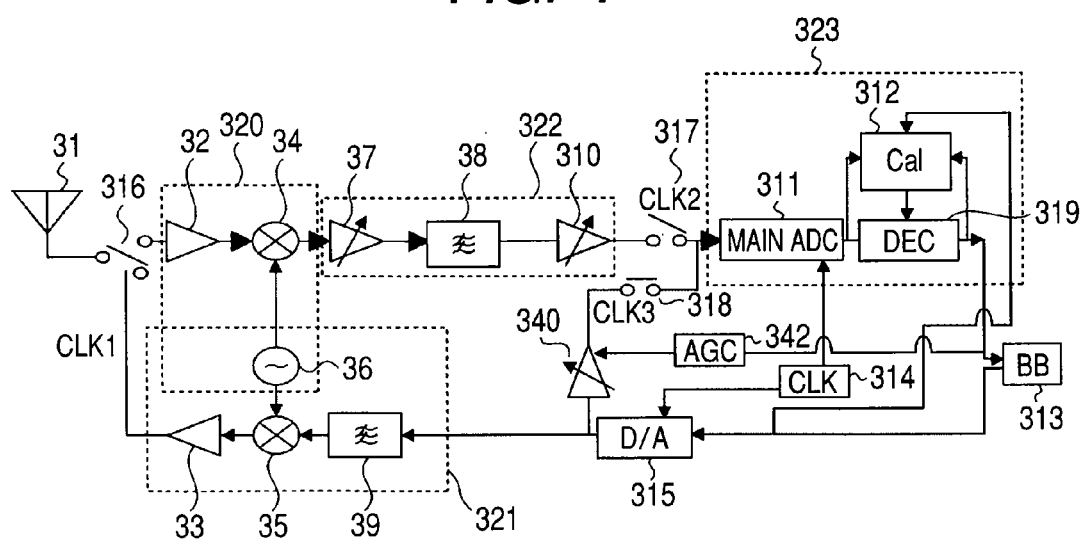
FIG. 7 is a view showing a basic configuration of a wireless transmitter and receiver circuit including an analog-to-digital converter according to a third embodiment of the present invention.

Next, a basic configuration of a communication device including a foreground calibration type analog-to-digital converter according to a third embodiment of the present invention will be described with reference to FIGS. 7 and 8. FIG. 7 shows the entire circuit configuration of the wireless transmitter and receiver to which the present invention is applied. Although the basic configuration and operation of the third embodiment is the same as the second embodiment, in the third embodiment, a variable gain amplifier 340 is inserted between the output of the digital-to-analog converter 315 and the input of the analog-to-digital converter 324. By such a configuration, the signal level input to the analog-to-digital converter 324 can be optimally controlled.

In FIG. 7, at the time of transmission, the first switch 316 is connected to the RF section 320 for transmission, the second switch 317 is opened, and the third switch 318 is closed, such that the output of the variable gain amplifier 310 is connected to the input of the analog-to-digital converter 323. In this state, the transmission signal output by the baseband signal processing section 313 is input to the digital-to-analog converter 315. The output of the digital-to-analog converter 315 is in waveform-shape in the filter 39 and then multiplied by the local oscillation signal generated from the voltage controlled oscillator 36 by the mixer 35 and amplified by the power amplifier 33, which is in turn transmitted from the antenna 31. Simultaneously with the above-mentioned transmission process, the transmission signal converted into the analog signal in the digital-to-analog converter 315 is amplified in the variable gain amplifier 340 and is also input to the analog-to-digital converter 323 through the third switch 318, such that the calibration of the analog-to-digital converter 323 is performed as in the first and second embodiments.

Further, the output of the analog-to-digital converter 323 is connected to an automatic gain control section 342. The automatic gain control section 342 detects the output amplitude of the analog-to-digital converter 323 and controls the gain of the variable gain amplifier 340 so that the input amplitude of the analog-to-digital converter 323 is optimal for the calibration. In this case, it goes without saying that it is necessary to adjust the gain G of the digital calibration signal d(cal) directly input to the calibration section 312 so that the signal level of the calibration signal Acal input to the analog-to-digital converter 323 through the variable gain amplifier 340 conforms to the signal level of the digital calibration signal directly input to the calibration section 312. In other words, it is necessary to adjust the gain of the digital calibration signal d(cal) directly input to the calibration section 312 so that the signal level of d(cal) conforms to the signal level of Acal which multiplied the gain of the digital-to-analog converter 315 by the gain of the variable gain amplifier 340 (the same in the following embodiments).

As describe above, the input amplitude to the analog-to-digital converter 323 is adjusted by the variable gain amplifier 340, such that the signal having the amplitude optimal to the calibration can be supplied to the input of the analog-to-digital converter 323 at any time even in the case where the amplitude of the transmission signal is not optimal for the calibration of the analog-to-digital converter 323.

Figure 8:
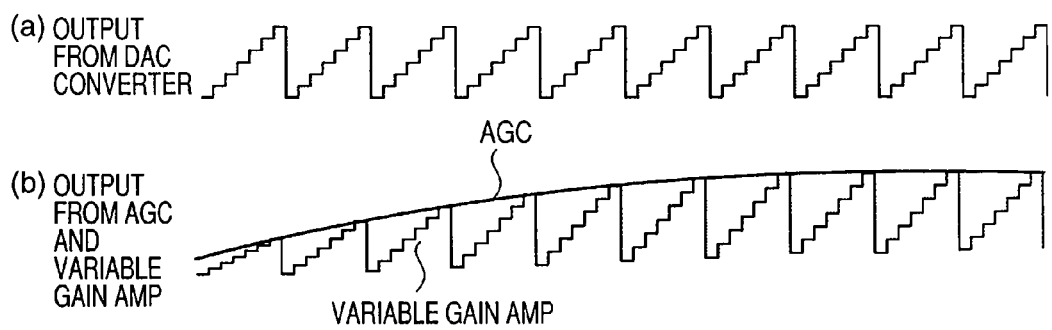
FIG. 8 is a view showing the passage of time of an output of a digital-to-analog converter according to the third embodiment and the passage of time of the output of the digital-to-analog whose amplitude is regulated by a variable gain amplifier.

FIG. 8(a) shows the timeline of the output of the digital-to-analog converter 315, and FIG. 8(b) shows the timeline of the outputs of the automatic gain control unit 342 and the variable gain amplifier 340. Even when the maximum value of the output of the variable gain amplifier 340 is a value that is not suitable for the calibration in an initial step, for example, 0.1 V, the maximum value of the output is sequentially increased such that it is a value optimal for the calibration, for example, can be increased to 1 V. (Further, although FIGS. 8,(a) and (b) show an example where the digital calibration signal is the triangle wave, the operation is the same if waveform use the transmission signal).

Since the signal having the amplitude optimal for calibration can be supplied, the high-speed and high-precision calibration can be achieved. Further, since it is preferable that the automatic gain control section 342 detects the amplitude value Dout converted into the digital value by the analog-to-digital converter 323, a simple configuration can be realized.

Further, since the third embodiment performs the automatic gain control of the feedback scheme, it can perform accurate gain control even when there are deviations in the characteristics of the variable gain amplifier 340. Consequently, the proper calibration of the analog-to-digital converter 323 can be performed. Also, it is possible to use section or the whole of the automatic gain control section 342 originally in the receiver circuit.

Fourth Embodiment

Figure 9:
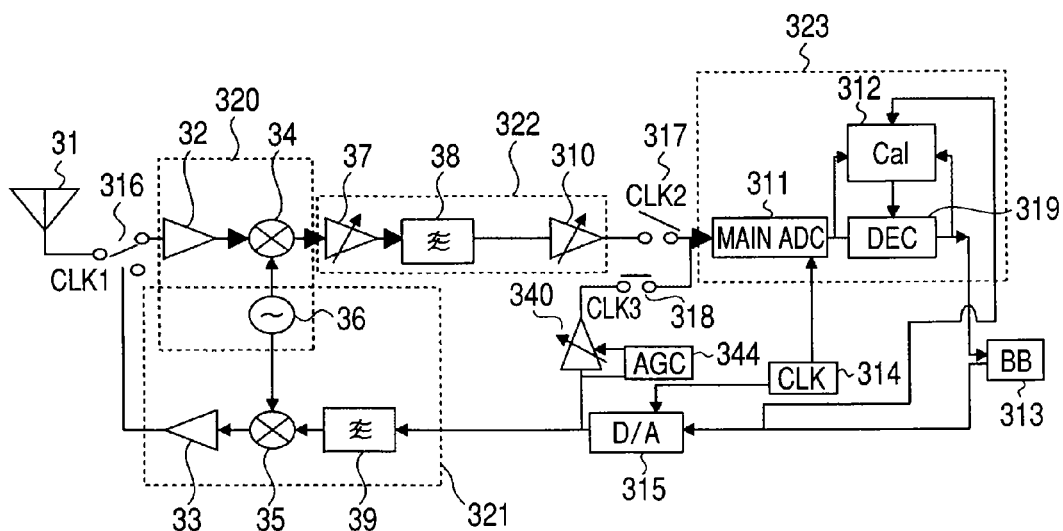
FIG. 9 is a view showing a basic configuration of a wireless transmitter and receiver circuit including an analog-to-digital converter according to a fourth embodiment of the present invention.

Next, a basic configuration of a communication device including a foreground calibration type analog-to-digital converter according to a fourth embodiment of the present invention will be described with reference to FIGS. 9 and 10. FIG. 9 shows the entire circuit configuration of the wireless transmitter and receiver to which the present invention is applied. Although the basic operation of the fourth embodiment is the same as the third embodiment, in the fourth embodiment, the variable gain amplifier 340 does not perform the feedback control as in the third embodiment but performs a feedforward control.

In FIG. 9, at the time of transmission, the first switch 316 is connected to the RF section 320 for transmission, the second switch 317 is opened, and the third switch 318 is closed, such that the output of the variable gain amplifier 310 is connected to the input of the analog-to-digital converter 323. In this state, the transmission signal output by the baseband signal processing section 313 is input to the digital-to-analog converter 315. The output of the digital-to-analog converter 315 is in waveform-shape in the filter 39 and then multiplied by the local oscillation signal generated from the voltage controlled oscillator 36 by the mixer 35 and amplified by the power amplifier 33, which is in turn transmitted from the antenna 31. Simultaneously with the above-mentioned transmission process, the transmission signal converted into the analog signal in the digital-to-analog converter 315 is amplified in the variable gain amplifier 340 and is then input to the analog-to-digital converter 323 through the third switch 318, such that the calibration of the analog-to-digital converter 323 is performed as in the second and third embodiments.

Further, the automatic gain control section 344 is connected to the input of the variable gain amplifier 340. The automatic gain control section 344 detects the input amplitude of the variable gain amplifier 340 and controls the gain of the variable gain amplifier 340 on the basis of the detected results so that the input amplitude of the analog-to-digital converter 323 is optimal to the calibration. Thereby, even when the amplitude of the transmission signal is not suitable for the calibration of the analog-to-digital converter 323, the amplitude of the variable gain amplifier 340 can be adjusted, such that the signal having the amplitude optimal to the calibration can be supplied to the input of the analog-to-digital converter 323 at any time, making it possible to achieve the high-speed and high-precision calibration.

Figure 10:
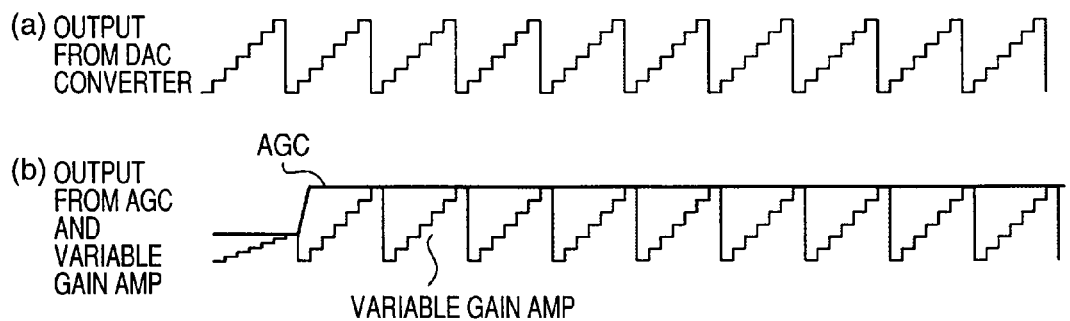
FIG. 10 is a view showing the passage of time of an output of the digital-to-analog converter according to the fourth embodiment and the passage of time of the output of the digital-to-analog whose amplitude is regulated by a variable gain amplifier.

FIG. 10(*a*) shows the timeline of the output of the digital-to-analog converter 315, and FIG. 10(*b*) shows the timeline of the outputs of the automatic gain control unit 344 and the variable gain amplifier 340. Even when the maximum value of the output of the variable gain amplifier 340 is a value that is not suitable for the calibration in an initial step, for example, 0.1 V, the maximum value of the output can be increased to, for example, 1 V that is optimal for the calibration from the next step. (Further, although FIGS. 10,(*a*) and (*b*) show an example where the digital calibration signal is the triangle wave, the operation is the same even if the waveform uses the transmission signal).

As described above, since the fourth embodiment performs the automatic gain control of the variable gain amplifier 340 using the feedforward scheme, the high-speed automatic gain control can be performed. Thereby, the high-speed calibration of the analog-to-digital converter 323 can be performed. Further, the automatic gain control section 344 may be permitted so as to use a section or all that is originally included in the receiver circuit.

Fifth Embodiment

Figure 11:
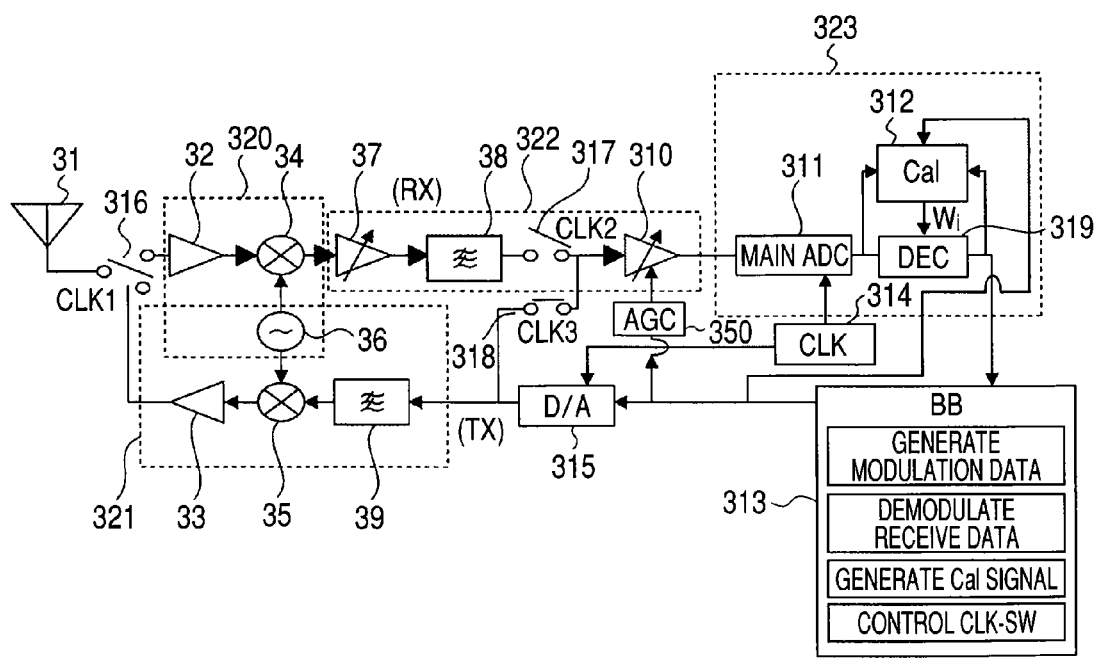
FIG. 11 is a view showing a basic configuration of a wireless transmitter and receiver circuit including an analog-to-digital converter according to a fifth embodiment of the present invention.

A basic configuration of a communication device including a foreground calibration type analog-to-digital converter according to a fifth embodiment of the present invention will be described with reference to FIG. 11. FIG. 11 shows the entire circuit configuration of the wireless transmitter and receiver to which the present invention is applied. Although the basic operation of the fifth embodiment is the same as the fourth embodiment, in the fifth embodiment, the signal amplitude input to the analog-to-digital converter 323 is controlled by, for example, the variable gain amplifier 310 of the end included in the intermediate frequency signal processing section 322 and the automatic gain control section 350 when performing the calibration.

In FIG. 11, at the time of transmission, the first switch 316 is connected to the RF section 321 for transmission, the second switch 317 is opened, and the third switch 318 is closed, such that the output of the digital-to-analog converter 315 is connected to the input of the variable gain amplifier 310. In this state, the transmission signal output by the baseband signal processing section 313 is input to the digital-to-analog converter 315. The output of the digital-to-analog converter 315 is in a waveform-shape in the filter 39 and then multiplied by the local oscillation signal generated from the voltage controlled oscillator 36 by the mixer 35, which is in turn transmitted from the antenna 31. Simultaneously with the above-mentioned transmission process, the transmission signal converted into the analog signal in the digital-to-analog converter 315 is amplified in the variable gain amplifier 310 and is also input to the analog-to-digital converter 323 through the third switch 318, such that the calibration of the analog-to-digital converter 323 is performed as in the second and third embodiments.

Further, the input of the digital-to-analog converter 315 is connected to the automatic gain control section 350. The automatic gain control section 350 detects the input amplitude of the digital-to-analog converter 315 and controls the gain of the variable gain amplifier 310 on the basis of the detected results so that the input amplitude of the analog-to-digital converter 323 is optimal to the calibration. Thereby, even when the amplitude of the transmission signal is not suitable for the calibration of the analog-to-digital converter 323, the amplitude can be adjusted by the variable gain amplifier 310, such that the signal having the amplitude optimal for the calibration can be supplied to the input of the analog-to-digital converter 323 at any time. For this reason, high-speed and high-precision calibration can be performed. Also, in the fifth embodiment, the variable gain amplifier 310 originally included in the receive circuit is diverted for the calibration of the analog-to-digital converter 323, such that the circuit area and the design manpower can be reduced.

In the fifth embodiment, since the digital value can be directly input to the automatic gain control section 350, the configuration of the automatic gain control section 350 is simple, such that the circuit area and the design manpower can be reduced. In particular, further, although the fifth embodiment is suitable for the case where the gain of the digital-to-analog converter 315 is not out of the design value by the manufacturing process, it is not limited thereto.

Also, for the purpose of supplying the signal having the optimal amplitude suitable for the calibration, it goes without saying that it is preferable to use the variable gain amplifier other than the end included in the intermediate frequency signal processing section 322.

Sixth Embodiment

Figure 12:
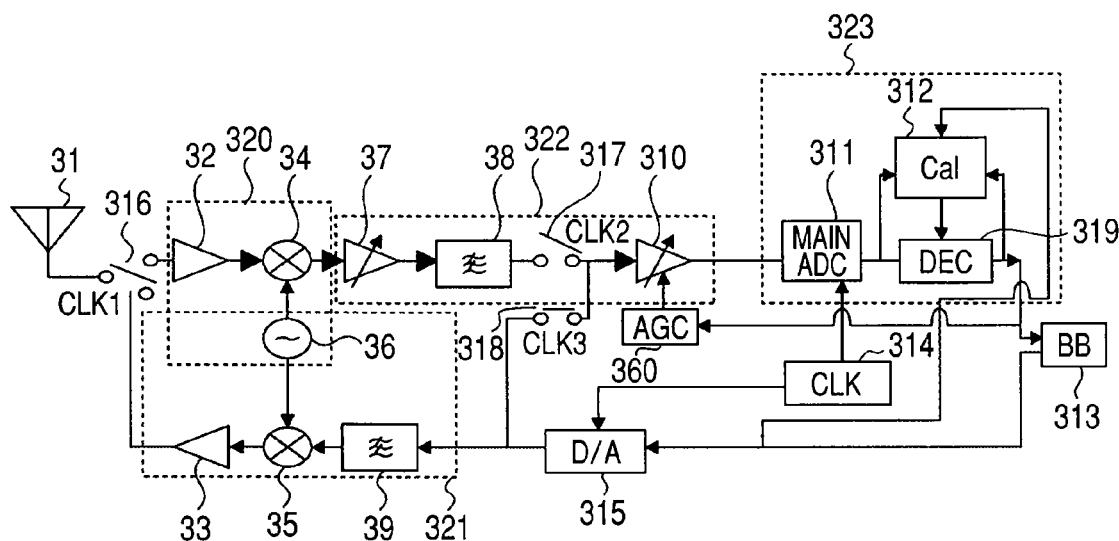
FIG. 12 is a view showing a basic configuration of a wireless transmitter and receiver circuit including an analog-to-digital converter according to a sixth embodiment of the present invention.

A basic configuration of a communication device including a foreground calibration type analog-to-digital converter according to a sixth embodiment of the present invention will be described with reference to FIG. 12. FIG. 12 shows the entire circuit configuration of the wireless transmitter and receiver to which the present invention is applied. Although the basic operation of the sixth embodiment is the same as the third embodiment, the sixth embodiment controls the signal amplitude input to the analog-to-digital converter 323, for example, in the automatic gain control section 360 and the variable gain amplifier 310 of the end included in the intermediate frequency signal processing section 322.

In FIG. 12, at the time of transmission, the first switch 316 is connected to the RF section 320 for transmission, the second switch 317 is opened, and the third switch 318 is closed, such that the output of the digital-to-analog converter 315 is connected to the input of the variable gain amplifier 310. In this state, the transmission signal output by the baseband signal processing section 313 is input to the digital-to-analog converter 315. The output of the digital-to-analog converter 315 is in a waveform-shape in the filter 39 and then multiplied by the local oscillation signal generated from the voltage controlled oscillator 36 by the mixer 35 and amplified by the power amplifier 33, which is in turn transmitted from the antenna 31. Simultaneously with the above-mentioned transmission process, the transmission signal converted into the analog signal in the digital-to-analog converter 315 is amplified in the variable gain amplifier 310 and is then input to the analog-to-digital converter 323 through the third switch 318, such that the calibration of the analog-to-digital converter 323 is performed as in the second and third embodiments.

Further, the automatic gain control section 360 is connected to the analog-to-digital control section 323. The automatic gain control section 360 detects the output amplitude of the analog-to-digital converter 323 and controls the gain of the variable gain amplifier 310 on the basis of the detected results so that the input amplitude of the analog-to-digital converter 323 is optimal to the calibration. Thereby, even when the amplitude of the transmission signal is not suitable for the calibration of the analog-to-digital converter 323, the amplitude can be adjusted by the variable gain amplifier 310, such that the signal having the amplitude optimal to the calibration can be supplied to the input of the analog-to-digital converter 323 at any time. For this reason, high-speed and high-precision calibration can be performed.

As such, the present embodiment diverts the variable gain amplifier 310 originally included in the receive circuit for the calibration of the analog-to-digital converter 323, such that the circuit area and the design manpower can be reduced. Also, since the automatic gain control section 360 may be permitted so as to detect the amplitude value Dout converted into the digital value by the analog-to-digital converter 323, a simple configuration can be realized. Also, since the present embodiment performs the automatic gain control of the feedback scheme, even when there are deviations in the characteristics of the variable gain amplifier 310, the accurate gain control can be performed at any time. Consequently, the proper calibration of the analog-to-digital converter can be performed. Also, the automatic gain control section 360 may be permitted so as to use a section or all that is originally included in the receiver circuit.

Seventh Embodiment

Figure 13:
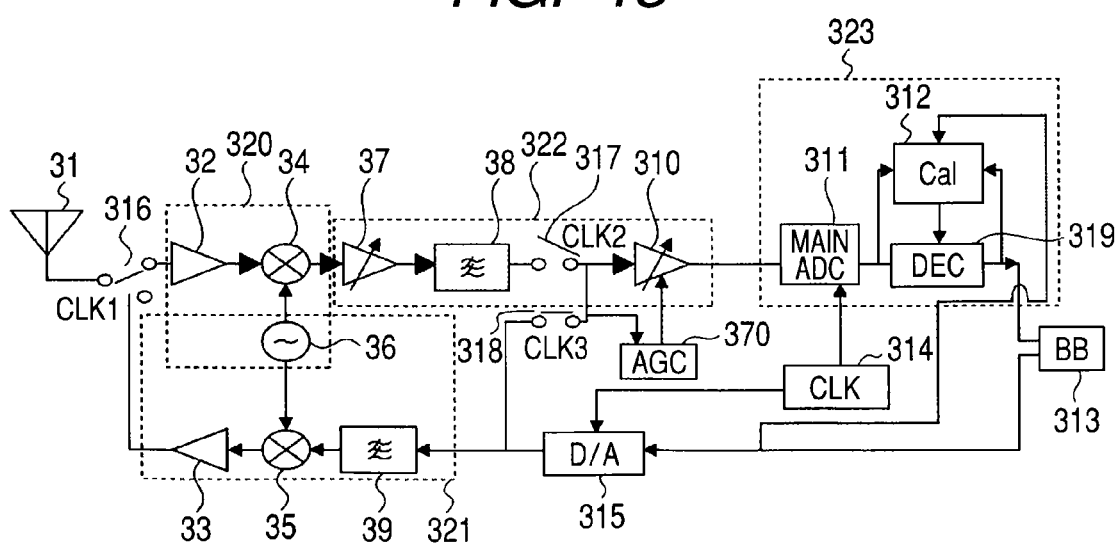
FIG. 13 is a view showing a basic configuration of a wireless transmitter and receiver circuit including an analog-to-digital converter according to a seventh embodiment of the present invention.

A basic configuration of a communication device including a foreground calibration type analog-to-digital converter according to a sixth embodiment of the present invention will be described with reference to FIG. 13. FIG. 13 shows the entire circuit configuration of the wireless transmitter and receiver to which the present invention is applied. Although the basic operation of the sixth embodiment is the same as the fourth embodiment, the seventh embodiment controls the signal amplitude input to the analog-to-digital converter 323, for example, in the automatic gain control section 370 and the variable gain amplifier 310 of the end included in the intermediate frequency signal processing section 322.

In FIG. 13, at the time of transmission, the first switch 316 is connected to the RF section 321 for transmission, the second switch 317 is opened, and the third switch 318 is closed, such that the output of the digital-to-analog converter 315 is connected to the input of the variable gain amplifier 310. In this state, the transmission signal output by the baseband signal processing section 313 is input to the digital-to-analog converter 315. The output of the digital-to-analog converter 315 is in a waveform-shape in the filter 39 and then multiplied by the local oscillation signal generated from the voltage controlled oscillator 36 by the mixer 35, which is in turn transmitted from the antenna 31. Simultaneously with the above-mentioned transmission process, the transmission signal converted into the analog signal in the digital-to-analog converter 315 is amplified in the variable gain amplifier 310 and is then input to the analog-to-digital converter 323 through the third switch 318, such that the calibration of the analog-to-digital converter 323 is performed as in the first and second embodiments.

Further, the automatic gain control section 370 is connected to the input of the variable gain amplifier 310. The automatic gain control section 370 detects the input amplitude of the variable gain amplifier 310 and controls the gain of the variable gain amplifier 310 on the basis of the detected results so that the input amplitude of the analog-to-digital converter 323 is optimal to the calibration. Thereby, even when the amplitude of the transmission signal is not suitable for the calibration of the analog-to-digital converter 323, the amplitude can be adjusted by the variable gain amplifier 310, such that the signal having the amplitude optimal to the calibration can be supplied to the input of the analog-to-digital converter 323 at any time. For this reason, the high-speed and high-precision calibration can be performed.

As such, the present embodiment diverts the variable gain amplifier 310 originally included in the receive circuit for the calibration of the analog-to-digital converter 323, such that the circuit area and the design manpower can be reduced. Also, since the present embodiment performs the automatic gain control of the variable gain amplifier 310 using the feedforward scheme, the high-speed automatic gain control can be performed. The high-speed calibration of the analog-to-digital converter can be performed on the basis of the result. Also, it is possible to use section or the whole of the automatic gain control section 370 originally in the receiver circuit.

Eighth Embodiment

In the embodiment described above, although the receive circuit including one analog-to-digital converter is shown, according to the configuration of the receive circuit, there is a case where two or more analog-to-digital converters are used.

Figure 14:
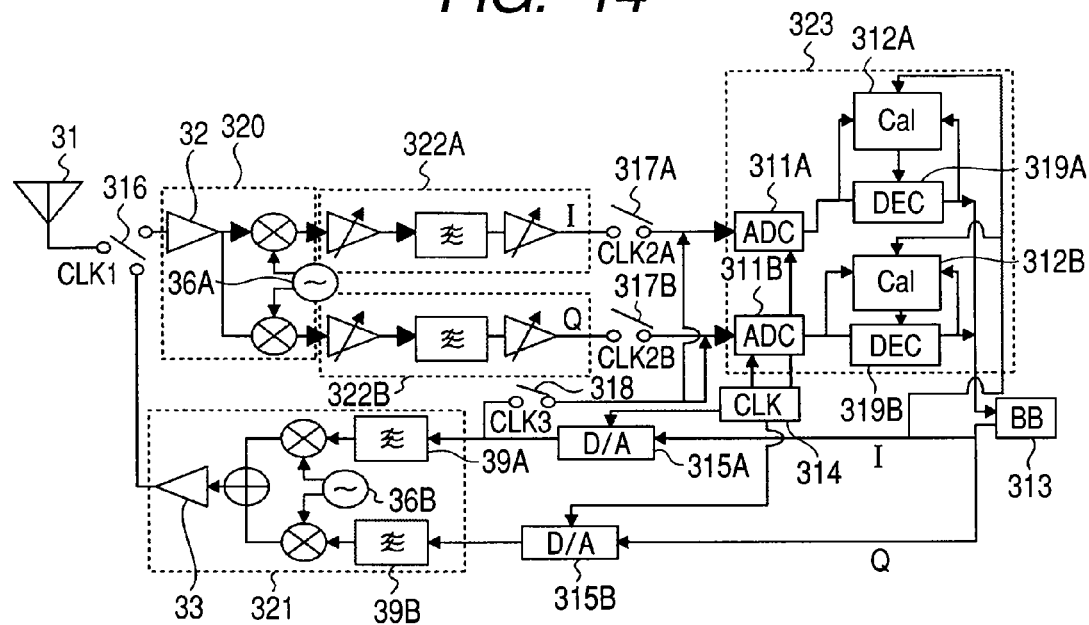
FIG. 14 is a view showing a basic configuration of a wireless transmitter and receiver circuit including an analog-to-digital converter according to an eighth embodiment of the present invention.

FIG. 14 shows a basic configuration of a communication device including an analog-to-digital converter according to an eighth embodiment of the present invention. In the eighth embodiment, instead of the first to seventh embodiments, the receiving section is provided with a foreground calibration type analog-to-digital converter 323 that includes two digital calibration type analog-to-digital converters (I-series, Q-series) having substantially the same configuration. The analog-to-digital 323 (I-series) includes an analog-to-digital conversion unit 311A, a digital output generating section 319A that is connected to the output of the analog-to-digital conversion unit, and a foreground calibration section 312A that is connected to the output of the analog-to-digital conversion unit, the output of the digital output generating section 319, and the input of the digital-to-analog converter. Further, the analog-to-digital converter 323 (Q-series) includes an analog-to-digital conversion unit 311B, a digital output generating section 319B that is connected to the output of the analog-to-digital conversion unit, and a foreground calibration section 312B that is connected to the output of the analog-to-digital conversion unit, the output of the digital output generating section, and the input of the digital-to-analog converter.

In the receive system, the receive signal is amplified in the high frequency amplifier 32 of the RF 320 for reception and is orthogonally-detected by the oscillation signal from VCO and a phase shifter of 90° and then converted into an I (In-phase)/Q (Quadrature-phase) signal, by means of two mixers. Further, in the intermediate frequency signal process section 322, each of the I/Q signals removes the interference wave components in the filter and is amplified in the variable gain amplifier and is converted into the digital signal in each of the two digital calibration type analog-to-digital converters 323 (I-series, Q-series).

In the transmission system, I/Q signals are input to the digital-to-analog converters 315A and 315B. Each output of the digital-to-analog converters 315A and 315B is in a waveform-shape in the filters 39A and 39B and then multiplied by the local oscillation signal generated from the voltage controlled oscillator 36 by the mixer, which is in turn transmitted from the antenna 31 through the power amplifier 33. Simultaneously with the above-mentioned transmission process, the transmission signal converted into the analog signal in the digital-to-analog converter 315A is also input to the analog-to-digital conversion units 311A and 311B of the two digital calibration type analog-to-digital converters 323 (I-series, Q-series) through the third switch (CLK3) 318. Further, the input signal of the digital-to-analog converter 315A is also input to each of the calibration sections 312A and 312B of the two digital calibration type analog-to-digital converters 323 (I-series, Q-series). Hereinafter, likewise the first embodiment, or the like, each calibration of the digital calibration type analog-to-digital converters 323 (I-series, Q-series) is performed.

Instead of the I-series digital digital-to-analog converter 315A, it goes without saying that the input signal and output signal of the Q-series digital-to-analog converter 315B may be used in the digital-to-calibration. In this case, it is preferable that the output of the Q-series digital-to-analog converter 315B is connected to the third switch 318 and the input of the Q-series digital-to-analog converter 315B is also connected to the I-series calibration section 312A and the Q-series calibration section 312B.

Moreover, as the use form of the digital-to-analog converter, it is preferable that the I-series calibration of the I-series calibration section 312A is performed using the I-series digital-to-analog converter 315A and the calibration of the Q-series calibration section 312B is performed using the Q-series digital-to-analog converter 315B. In this case, the output of the I-series digital-to-analog converter 315A is input to the I-series analog-to-digital conversion unit 311A through the third switch A and the output of the Q-series digital-to-analog converter 315B is input to the Q-series analog-to-digital conversion unit 311B through the third switch B. Also, it is preferable that the input of the I-series digital-to-analog converter 315A is input to the I-series calibration section 312A and the input of the Q-series digital-to-analog converter 315B is input to the Q-series calibration section 312B.

Also, even though the transmission system is a configuration that includes one-series digital converter 315 and 1-series RF section 321 for transmission, that is, only the 1-series filter 39 or the mixer, the method disclosed in the eighth embodiment is effective. In this case, the 1-series digital signal is output from the baseband signal processing section 313, likewise the first to seventh embodiments and converted into the analog signal in the 1-series digital-to-analog converter 315 and is simultaneously input to the I-series analog-to-digital conversion unit 311A and the Q-series analog-to-digital conversion unit 311B through the I-series filter 39 and the third switch 318. Further, the input of the 1-series digital-to-analog converter 315 is simultaneously input to the I-series calibration section 312A and the Q-series calibration section 312B. In the above-mentioned connection, the I-series analog-digital converter and the Q-series analog-to-digital converter are simultaneously calibrated using the 1-series digital-to-analog converter 315 as described above.

The configuration and function of each digital calibration type analog-to-digital converters are the same as the above-mentioned embodiments. As such, since the received RF signal is converted into the IQ signals, the present invention can be applied to the method that performs each analog-to-digital conversion. The effect of the eighth embodiment is the same as the effect of the above-mentioned embodiments.

Ninth Embodiment

Figure 15:
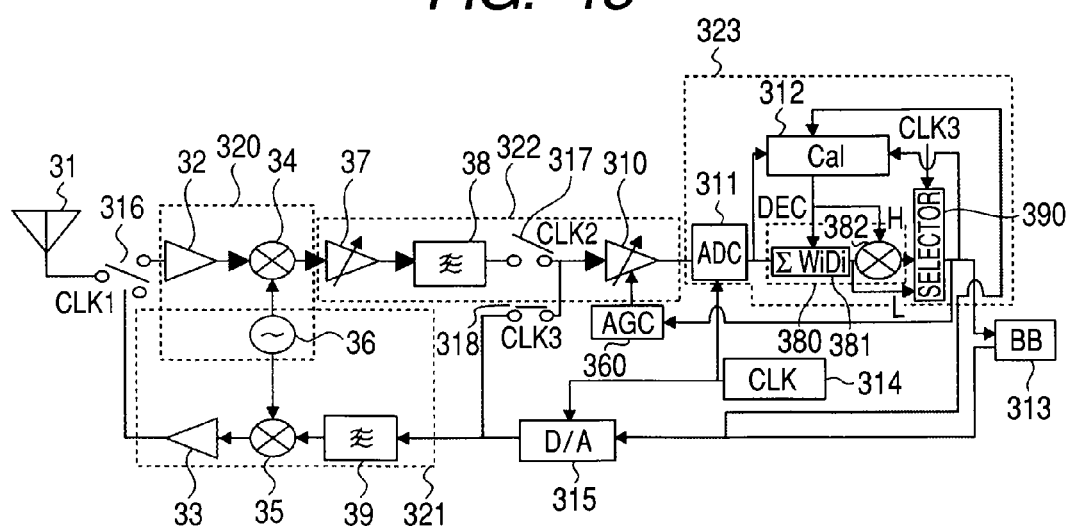
FIG. 15 is a view showing an entire configuration of a communication device including an analog-to-digital converter according to a ninth embodiment of the present invention.

A basic configuration of a communication device including a foreground calibration type analog-to-digital converter according to a ninth embodiment of the present invention will be described with reference to FIG. 15. FIG. 15 shows the entire circuit configuration of the wireless transmitter and receiver to which the present invention is applied. The ninth embodiment has a calibration function that performs the calibration by allowing the digital output generating section to correct the deviations of the digital-to-analog converter when the deviation in the design value of the gain of the digital-to-analog converter is expected and a analog-to-digital conversion function that performs only the calibration of a weight coefficient without performing the correction process and outputs the results. The other operations of the ninth embodiment are as follows.

In FIG. 15, the digital output generating section 380 includes a digital output generating unit 381, a multiplier 382, and a selector 390. The digital output generating unit 381 has the same function as the digital output generating section 319 described above in the embodiments 1 to 8. The multiplier 382 has a function that multiplies the correction coefficient correcting the deviation in the design value of the gain of the digital-to-analog converter 315 by the output of the digital output generating unit 381 when performing the calibration. For example, if the gain of the digital-to-analog converter 315 is K times as many as the design value, it is automatically controlled by the calibration section 312 so that the correction coefficient in the multiplier 382 becomes 1/K, thereby correcting the output of the digital output generating unit 381. As a result, the accurate weight coefficient Wi can be obtained regardless of the deviation of the gain of the digital-to-analog converter 315.

The selector 390 is controlled, for example, in the switch control signal CLK3 and when the wireless transmitter and receiver performs transmission, for example, as shown in FIG. 6,(a)-(c), the switch control signal CLK3 becomes high and the calibration of the analog-to-digital conversion unit 311 is performed, such that the value multiplying the output of the digital output generating unit 381 by the correction coefficient is selected as the output of the digital output generating section 380. On the other hand, when the wireless transmitter and receiver performs the reception, the switch control signal CLK3 becomes low such that the value not multiplying the output of the digital output generating unit 381 by the correction coefficient is selected as the output of the digital output generating section 380. In other words, at the time of reception, the input analog signal is converted into the digital signal in the analog-to-digital converter when the calibration completes, such that the result is output.

According to the ninth embodiment, even in the case where the gain of the digital-to-analog converter deviates with respect to the design value, high-speed and high-precision calibration can be performed. Also, although the present embodiment shows the case of correcting the deviation in the gain of the digital-to-analog 315 as one embodiment, it goes without saying that the non-linearity (DNL/INL) of the digital-to-analog converter 315 can be corrected.

Tenth Embodiment

Figure 16:
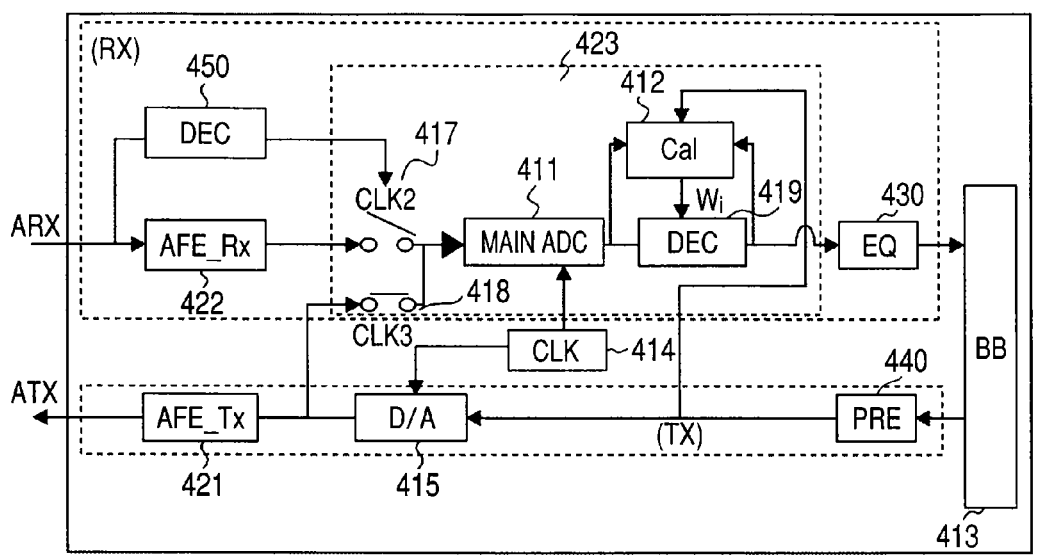
FIG. 16 is a view showing an entire circuit configuration of a wired transmitter and receiver circuit including an analog-to-digital converter according to a tenth embodiment of the present invention.
Figure 17:
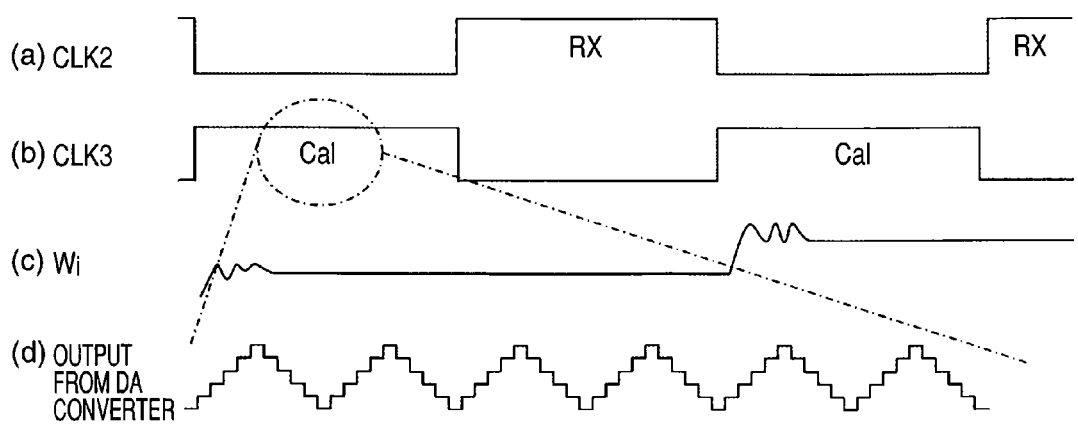
FIG. 17 is a time chart showing an operation of the analog-to-digital converter of a tenth embodiment of the present invention.
Figure 18:
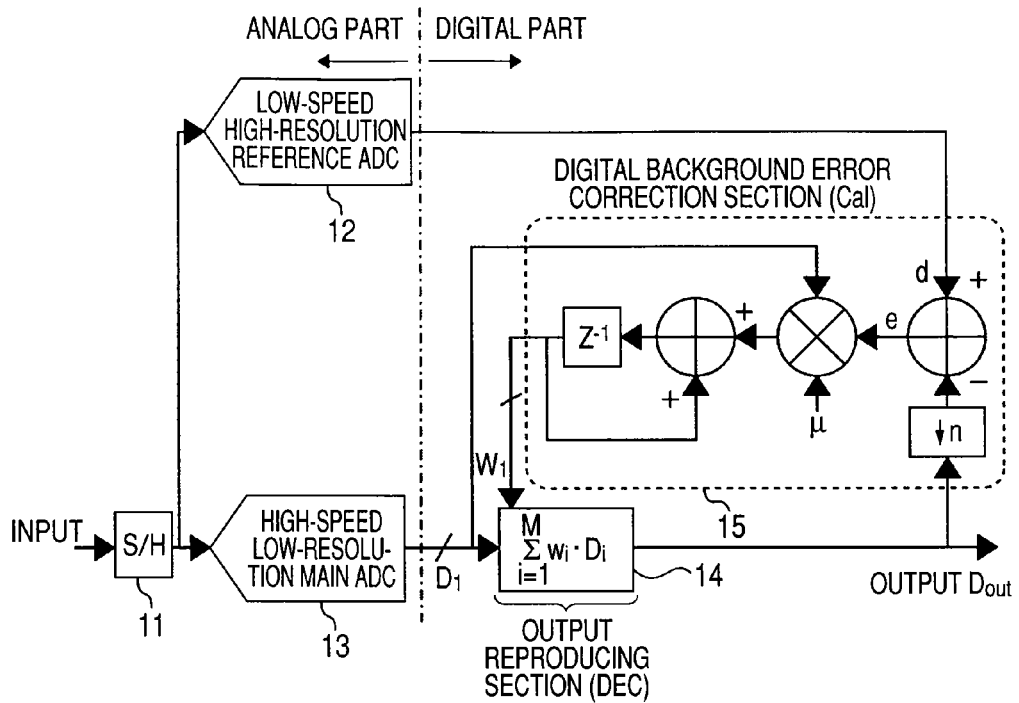
FIG. 18 is a view showing a configuration example of a calibration type analog-to-digital converter according to the related art.
Figure 19:
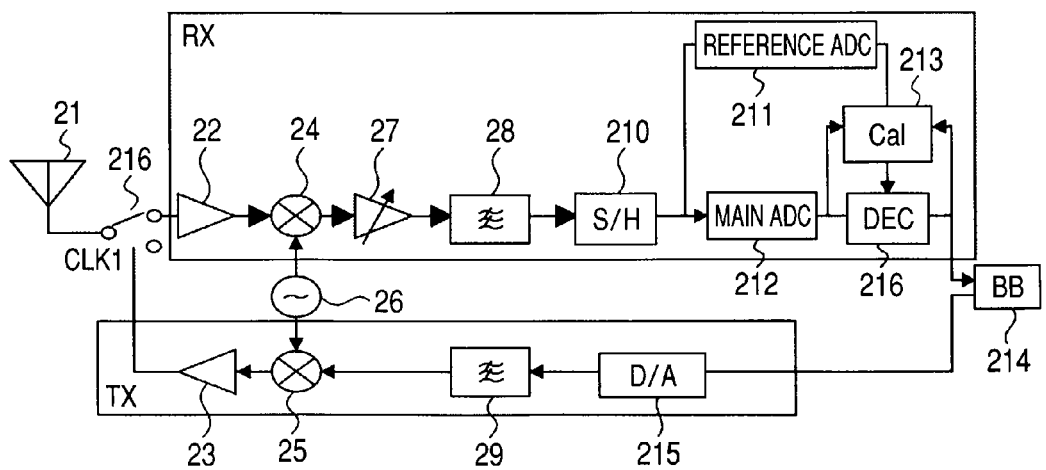
FIG. 19 is a view showing a configuration example of a wireless transmitter and receiver circuit according to the related art including the analog-to-digital converter of FIG. 18.

A basic configuration of a communication device including a foreground calibration type analog-to-digital converter according to a tenth embodiment of the present invention will be described with reference to FIGS. 16 and 17. FIG. 16 shows the entire circuit configuration of the wired transmitter and receiver to which the present invention is applied. FIG. 17 is a time chart showing the operation of the analog-to-digital converter according to the tenth embodiment.

In FIG. 16, the receive circuit RX of the wired transmitter and receiver includes an analog front end section 422 for reception, a foreground calibration type analog-to-digital converter 423 that is connected to the output of the analog front end section through the second switch (CLK2) 417, and an equalizer (EQ) 430. The output terminal of the equalizer (EQ) 430 is connected to the baseband signal processing section 413. On the other hand, the transmission circuit TX includes a pre-emphasis circuit 440 that is connected to the output of the baseband signal processing section 413, a digital-to-analog converter 415 that is connected to the output of the pre-emphasis circuit, an analog front end section 421 for transmission that is connected to the output of the digital-to-analog converter.

The analog-to-digital converter 423 includes an analog-to-digital conversion unit (main ADC) 411, a digital output generating section (DEC) 419 that is connected to the output of the analog-to-digital conversion unit, and a foreground calibration section 412 that is connected to the output of the analog-to-digital conversion unit 411, the output of the digital output generation section 419, and the input of the digital-to-analog converter 415. The CLK generating section 414 supplies the clock signals, which are synchronized with each other, to the analog-to-digital conversion unit 411 and the digital-to-analog converter 415. Further, the configuration and action of each component of the analog-to-digital converter 423 are the same as described with reference to each embodiment.

The output of the digital-to-analog converter 415 is connected to the analog-to-digital conversion unit 411 of the analog-to-digital converter 423 through the third switch (CLK3) 418. A signal detecting section (DET) 450, which detects whether there is a receive analog signal, is installed at the analog front end section 422 for reception in parallel and when there is no receive analog signal, the second switch CLK2 is opened and the third switch CLK3 is closed and is operated so that when there is the receive analog signal, the second switch CLK2 is closed and the third switch CLK3 is opened.

Therefore, as shown in FIGS. 17,(a) and (b), when there is no receive analog signal, the third switch (CLK3) 418 is closed, such that the calibration of the analog-to-digital conversion unit 411 is performed using the input digital signal to the foreground calibration section 412 and the analog signal output through the digital-to-analog converter 415. On the other hand, when there is a receive analog signal, the second switch CLK2 is closed, such that the digital conversion process is performed by the analog-to-digital conversion unit 411. Further, in the system where the receive timing of the receive analog signal is previously known, instead of the signal detecting section DET, the second switch and the third switch may be controlled in the baseband signal processing section 413.

The communication device of the tenth embodiment can be used for the wired transmitter and receiver, such as the serial transmitter and receiver for high-speed serial transmission, the transmitter and receiver for 10/100 Gb Ethernet (Registration Mark), the transmitter and receiver for an optical link, etc.

According to the present invention, even when a period is short where there is no receive analog signal high-speed and high-precision calibration is performed and the receive process of the high-data rate receiving analog signals can be performed with high precision.

What is claimed is:

1. An analog-to-digital converter that is used for a receiver circuit of a communication device and performs calibration using a digital signal, the analog-to-digital converter comprising:

an analog-to-digital conversion unit that converts an input analog signal into a digital signal;

a calibration section that is connected to an output side of the analog-to-digital conversion unit;

a digital output generating section that receives an output of the analog-to-digital conversion unit; and a transfer switch that is installed at an input side of the analog-to-digital conversion unit, wherein the transfer switch has a function that inputs either an analog input signal received by the receiver circuit or an analog signal for calibration, which is obtained by performing digital-to-analog conversion on a digital signal for calibration in a digital-to-analog converter in a transmitter circuit of the communication device, to the analog-to-digital conversion unit, wherein the calibration section is connected to an output of the digital output generating section, an output of the analog-to-digital conversion unit, and an input of the digital-to-analog converter, and wherein the calibration section has a function of acquiring parameters that calibrate the output signal of the analog-to-digital conversion unit, using the digital signal for calibration and an output digital signal of the analog-to-digital conversion unit obtained by inputting the analog signal for calibration to the analog-to-digital conversion unit.

2. The analog-to-digital converter according to claim 1, further comprising:

a regulator that regulates a gain between the digital signal for calibration and a digital signal output of the digital output generating section by inputting the analog signal for calibration to the analog-to-digital conversion unit.

3. The analog-to-digital converter according to claim 1, wherein the analog-to-digital conversion unit comprising a pipeline type analog-to-digital converter section having a configuration of multiplying DAC (MDAC), and wherein the transfer switch uses a sampling switch in the MDAC of an initial stage of the analog-to-digital conversion unit.

4. The analog-to-digital converter according to claim 1, wherein the digital signal for calibration is a digital signal for transmission of the communication device.

5. The analog-to-digital converter according to claim 4, wherein the analog-to-digital conversion unit converts the input analog signal received in the communication device into the digital signal.

6. The analog-to-digital converter according to claim 1, wherein the digital output generating section has a calibration function of performing the calibration by performing correction on deviations in a design value of the digital-to-analog converter and an analog-to-digital conversion function of not performing the correction but performing the digital conversion of the input analog signal and outputting the conversion result.

7. A communication device comprising:

a receiver circuit that includes an analog-to-digital converter performing calibration using a digital signal;

a baseband signal processing section that is connected to an output of the analog-to-digital converter; and a transmitter circuit that includes a digital-to-analog converter connected to an output of the baseband signal processing section, wherein the analog-to-digital converter includes:

an analog-to-digital conversion unit that converts a received analog signal into a digital signal;

a calibration section that is connected to an output side of the analog-to-digital conversion unit;

a digital output generating section that receives an output of the analog-to-digital conversion unit; and a transfer switch that is installed at an input side of the analog-to-digital conversion unit, wherein the transfer switch has a function of inputting either an analog input signal received by the receiver circuit or an analog signal for calibration, which is obtained by performing digital-to-analog conversion on a digital signal for calibration in the digital-to-analog converter in a transmitter circuit, to the analog-to-digital conversion unit, wherein the calibration section is connected to an output of the digital output generating section, an output of the analog-to-digital conversion unit, and an input of the digital-to-analog converter, and wherein the calibration section has a function of acquiring parameters that calibrate the output signal of the analog-to-digital conversion unit, using the digital signal for calibration and an output digital signal of the analog-to-digital conversion unit obtained by inputting the analog signal for calibration to the analog-to-digital conversion unit.

8. The communication device according to claim 7, wherein the receiver circuit includes an RF section for reception, an intermediate frequency signal processing section that is connected to an output of the RF section for reception, and the analog-to-digital converter that is connected to an output of the intermediate frequency signal processing section, wherein the transmitter circuit includes the digital-to-analog converter that is connected to an output of the baseband signal processing section and an RF section for transmission that is connected to an output of the digital-to-analog converter, and wherein the transfer switch is configured to operate in synchronization with a time division duplex (TDD) signal.

9. The communication device according to claim 7, wherein the baseband signal processing section has a function of generating the digital signal for calibration.

10. The communication device according to claim 7, wherein the digital signal for calibration is a digital signal for transmission that is generated in the baseband signal processing section.

11. The communication device according to claim 7, further comprising a variable gain amplifier that is inserted between the output of the digital-to-analog converter and the analog-to-digital converter, wherein the gain of the variable gain amplifier is controlled so that the input of the analog-to-digital converter is optimally suited to the calibration.

12. The communication device according to claim 11, further comprising:

an automatic gain controlling section that is connected to the output of the digital output generating section, wherein the gain of the variable gain amplifier is controlled by the output of the automatic gain controlling section, and wherein the automatic gain controlling section detects an amplitude of the output signal of the digital output generating section and controls the gain of the variable gain amplifier on the basis of the detected result, such that it is configured to control the gain of the variable gain amplifier so as to optimally suit the input of the analog-to-digital converter connected to the output of the variable gain amplifier to the calibration.

13. The communication device according to claim 11, wherein the automatic gain controlling section, which is connected to the input of the variable gain amplifier, detects an amplitude of the input of the variable gain amplifier and controls the gain of the variable gain amplifier on the basis of the detected result, and wherein the automatic gain controlling section is configured to control the input of the analog-to-digital converter to be optimally suited for the calibration.

14. The communication device according to claim 7, wherein the receiver circuit includes an RF section for reception in two systems corresponding to an I/Q signal, an intermediate frequency signal processing section, and the analog-to-digital converter, wherein the transmitter circuit includes either one of a 1-series of the digital-to-analog converter and an RF section or a 2-series of the digital-to-analog converter and an RF section each of which corresponding to the I/Q signal, and wherein the calibration of the 2-series analog-to-digital converter of the receiver circuit is performed using either one of the input digital signal and the output analog signal of any one of digital-to-analog converters of the 1-series digital-to-analog converter, any one of the 2-series digital-to-analog converter or both of the 2-series digital-to-analog-to-digital converters.

15. A wireless transceiver comprising:

a first switch that switches transmission and reception;

an RF section for reception that is connected to the first switch and an intermediate frequency signal processing section that is connected to the output of the RF section;

an analog-to-digital converter that is connected to the output of the intermediate frequency signal processing section by a second switch and performs calibration using a digital signal;

a baseband signal processing section that is connected to an output of the analog-to-digital converter;

a digital-to-analog converter that is connected to an output of the baseband signal processing section;

an RF section for transmission that is connected to an output of the digital-to-analog converter and the first switch and a third switch that connects the output of the digital-to-analog converter to an input of the analog-to-digital converter; and a switch control section that controls opening and closing of the first to third switches, wherein the output of the digital-to-analog converter is connected to the input of the analog-to-digital converter, wherein the intermediate frequency signal processing section includes at least one variable gain amplifier, wherein the analog-to-digital converter includes an analog-to-digital conversion unit, a digital output generating section that is connected to the output of the analog-to-digital converter, and a calibration section that is connected to the output of the digital output generating section, the output of the analog-to-digital conversion unit, and the input of the digital-to-analog converter, wherein the analog-to-digital conversion unit corresponds to a high sample rate having low precision, and wherein parameters for calibrating the output of the analog-to-digital conversion unit to the output of the calibration section are acquired by inputting the output of the digital-to-analog converter to the analog-to-digital converter and inputting the output of the analog-to-digital conversion unit, the input of the digital-to-analog converter, and the output of the digital output generating section to the calibration section, whereby the output of the digital output generating section is the output of the analog-to-digital converter by inputting the parameters and the output of the analog-to-digital conversion unit to the digital output generating section.

16. The wireless transceiver according to claim 15, wherein, at the time of transmission, the first switch is connected to an RF section side for transmission by the switch control section, the third switch is closed and the second switch is opened, such that the first switch connects an antenna to the RF section for transmission and the third switch connects an output of the digital-to-analog converter to the input of an analog-to-digital converter, wherein a transmission signal output by the baseband signal processing section is input to the digital-to-analog converter and the output of the digital-to-analog converter is input to the analog-to-digital converter through the RF section for transmission and the third switch, and an output of the RF section for transmission is transmitted as the transmission signal from the antenna, and wherein the calibration is performed by transmitting the transmission signal from the antenna as well as inputting the output of the digital-to-analog converter to the analog-to-digital converter through the third switch.

17. The wireless transceiver according to claim 15, wherein, at the time of transmission, the first switch is connected to an RF section side for transmission by the switch control section, the second switch is opened and the third switch is opened, such that the output of the baseband signal processing section is input to the digital-to-analog converter, the output of the digital-to-analog converter is input to the RF section for transmission, and the output of the RF section for transmission is transmitted as a transmission signal from an antenna, and wherein, after a transmission period completes, the second switch is opened and the third switch is closed by the switch control section, such that the output of the digital-to-analog converter is input to the analog-to-digital converter through the third switch to perform the calibration.

18. The wireless transceiver according to claim 15, wherein the output of the digital-to-analog converter is connected through the third switch to the variable gain amplifier used for the intermediate frequency signal processing section, and wherein the gain of the variable gain amplifier is controlled, such that the input of the analog-to-digital converter is optimal for the calibration.

19. The wireless transceiver according to claim 18, wherein the output of the digital output generating section is connected to an automatic gain control section, wherein the gain of the variable gain amplifier is configured to be controlled by the output of the automatic gain control section, and wherein the automatic gain control section performs amplitude detection of the output signal of the digital output generating section and controls the gain of the variable gain amplifier on the basis of the detected results, such that the input of the analog-to-digital converter connected to the variable gain amplifier is optimal for the calibration.

20. The wireless transceiver according to claim 15, further comprising:

a variable gain amplifier between the digital-to-analog converter and the analog-to-digital converter; and an automatic gain control section that is connected to an input of the variable gain amplifier, wherein the automatic gain control section performs input amplitude detection of the variable gain amplifier and controls the gain of the variable gain amplifier on the basis of the detected results, such that the input of the analog-to-digital converter is optimal for the calibration.

* * * * *